United States Patent
Park et al.

(10) Patent No.: US 11,930,646 B2
(45) Date of Patent: Mar. 12, 2024

(54) RESISTIVE MEMORY DEVICE

(71) Applicant: Samsung Electronics Co., Ltd., Suwon-si (KR)

(72) Inventors: Jeonghee Park, Hwaseong-si (KR); Jonguk Kim, Yongin-si (KR); Byeongju Bae, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 492 days.

(21) Appl. No.: 17/224,303

(22) Filed: Apr. 7, 2021

(65) Prior Publication Data

US 2022/0037401 A1 Feb. 3, 2022

(30) Foreign Application Priority Data

Jul. 28, 2020 (KR) .......................... 10-2020-0093854

(51) Int. Cl.
*H10B 63/00* (2023.01)
*H10N 70/00* (2023.01)
*H10N 70/20* (2023.01)

(52) U.S. Cl.
CPC ............. *H10B 63/80* (2023.02); *H10B 63/24* (2023.02); *H10N 70/063* (2023.02); *H10N 70/231* (2023.02)

(58) Field of Classification Search
CPC ...................................................... H10B 63/80
See application file for complete search history.

(56) References Cited

U.S. PATENT DOCUMENTS

| | | | |
|---|---|---|---|
| 7,619,237 B2 | 11/2009 | Lung | |
| 7,767,491 B2 | 8/2010 | Horii et al. | |
| 8,031,518 B2 | 10/2011 | Meade | |
| 8,298,956 B2 | 10/2012 | Yang | |
| 9,190,609 B2 | 11/2015 | Zheng | |
| 9,608,042 B2 | 3/2017 | Pellizzer et al. | |
| 9,978,810 B2* | 5/2018 | Pellizzer | H10N 70/011 |
| 11,444,127 B2* | 9/2022 | Lee | H10N 70/801 |
| 2007/0249086 A1 | 10/2007 | Philipp et al. | |
| 2018/0069177 A1* | 3/2018 | Nakao | H01L 27/105 |
| 2020/0066988 A1 | 2/2020 | Lee | |
| 2020/0235165 A1* | 7/2020 | Cui | H10B 63/24 |

FOREIGN PATENT DOCUMENTS

KR   1020090124121 A   12/2009

* cited by examiner

*Primary Examiner* — Mounir S Amer
(74) *Attorney, Agent, or Firm* — Muir Patent Law, PLLC

(57) ABSTRACT

A resistive memory device includes a plurality of first conductive lines in a first area and a second area on a substrate, a plurality of second conductive lines in the first area and the second area, the plurality of second conductive lines being apart from the plurality of first conductive lines in a vertical direction, and a plurality of memory cells connected to the first and second conductive lines at a plurality of intersections between the plurality of first and second conductive lines in the first area and the second area. The plurality of memory cells include an active memory cell in the first area and a dummy memory cell in the second area. The active memory cell including a first resistive memory pattern having a first width and the dummy memory cell including a second resistive memory pattern having a second width greater than the first width.

20 Claims, 31 Drawing Sheets

RESISTIVE MEMORY DEVICE

CROSS-REFERENCE TO RELATED APPLICATION

This application is based on and claims priority under 35 U.S.C. § 119 to Korean Patent Application No. 10-2020-0093854, filed on Jul. 28, 2020, in the Korean Intellectual Property Office, the disclosure of which is incorporated by reference herein in its entirety.

BACKGROUND

The inventive concept relates to a memory device, and more particularly, to a resistive memory device having a cross point array structure.

Provided is a resistive memory device having a three-dimensional cross-point stacked structure in which a memory cell is arranged at an intersection between two electrodes crossing each other. As the high-speed and large-capacity of resistive memory devices are continuously required, development of a new structure that improves the reliability of resistive memory patterns and extends the life of resistive memory devices in a memory cell array constituting the cross-point stacked resistive memory device is desired.

SUMMARY

Aspects of the inventive concept provides a resistive memory device having a structure capable of improving the reliability of a resistive memory pattern and extending the life of the resistive memory device in a memory cell array thereof.

According to an aspect of the inventive concept, there is provided a resistive memory device including: a plurality of first conductive lines extending in a first horizontal direction in a first area and a second area on a substrate, the first horizontal direction being parallel to the substrate; a plurality of second conductive lines extending in a second horizontal direction crossing the first horizontal direction in the first area and the second area, the plurality of second conductive lines being apart from the plurality of first conductive lines in a vertical direction, the vertical direction being perpendicular to the substrate; and a plurality of memory cells connected to the first conductive line and the second conductive line at a plurality of intersections between the plurality of first conductive lines and the plurality of second conductive lines in the first area and the second area, wherein the plurality of memory cells include an active memory cell in the first area and a dummy memory cell in the second area, the active memory cell including a first resistive memory pattern having a first width in a horizontal direction, and the dummy memory cell including a second resistive memory pattern having a second width in the horizontal direction, and the first width is less than the second width.

According to another aspect of the inventive concept, there is provided a resistive memory device including: a plurality of first conductive lines extending in a first horizontal direction in a first area and a second area on a substrate, the first horizontal direction being parallel to the substrate; a plurality of second conductive lines extending in a second horizontal direction crossing the first horizontal direction in the first area and the second area, the plurality of second conductive lines being apart from the plurality of first conductive lines in a vertical direction, the vertical direction being perpendicular to the substrate; a plurality of memory cells connected to the first conductive line and the second conductive line at a plurality of intersections between the plurality of first conductive lines and the plurality of second conductive lines in the first area and the second area; a plurality of resistive memory patterns included in the plurality of memory cells in the first area and the second area; and an insulating layer configured to fill a space between each of the plurality of memory cells in the first area and the second area, wherein a first volume of a first resistive memory pattern in the first area of the plurality of resistive memory patterns is less than a second volume of a second resistive memory pattern in the second area.

According to another aspect of the inventive concept, there is provided A resistive memory device including: a plurality of memory cells in a first area and a second area on a substrate; a plurality of encapsulation insulating layers in contact with sidewalls of each of the plurality of memory cells in the first area and the second area; and a plurality of gap fill insulating layers configured to fill a space between each of the plurality of memory cells at locations apart from each of the plurality of memory cells in a horizontal direction in the first area and the second area, the plurality of gap fill insulating layers having a thermal expansion coefficient greater than that of a constituent material of the plurality of encapsulation insulating layers, the horizontal direction being parallel to the substrate, wherein the plurality of memory cells include a plurality of active memory cells in the first area and including a first resistive memory pattern having a first width in the horizontal direction, and a plurality of dummy memory cells in the second area and including a second resistive memory pattern having a second width in the horizontal direction, and the first width is less than the second width.

BRIEF DESCRIPTION OF THE DRAWINGS

Embodiments of the inventive concept will be more clearly understood from the following detailed description taken in conjunction with the accompanying drawings in which:

FIGS. 11A through 20B are diagrams illustrating a manufacturing method of a resistive memory device according to a process sequence, according to embodiments of the inventive concept. FIGS. 11A, 12A, 13, 14, 15A, 16, 17, 18, 19A, and 20A are cross-sectional views illustrating an example manufacturing method of the resistive memory device according to a process sequence, FIG. 20B is an enlarged cross-sectional view of regions indicated by CX1 and CX2 in FIG. 20A.

DETAILED DESCRIPTION OF THE EMBODIMENTS

Figure 1:
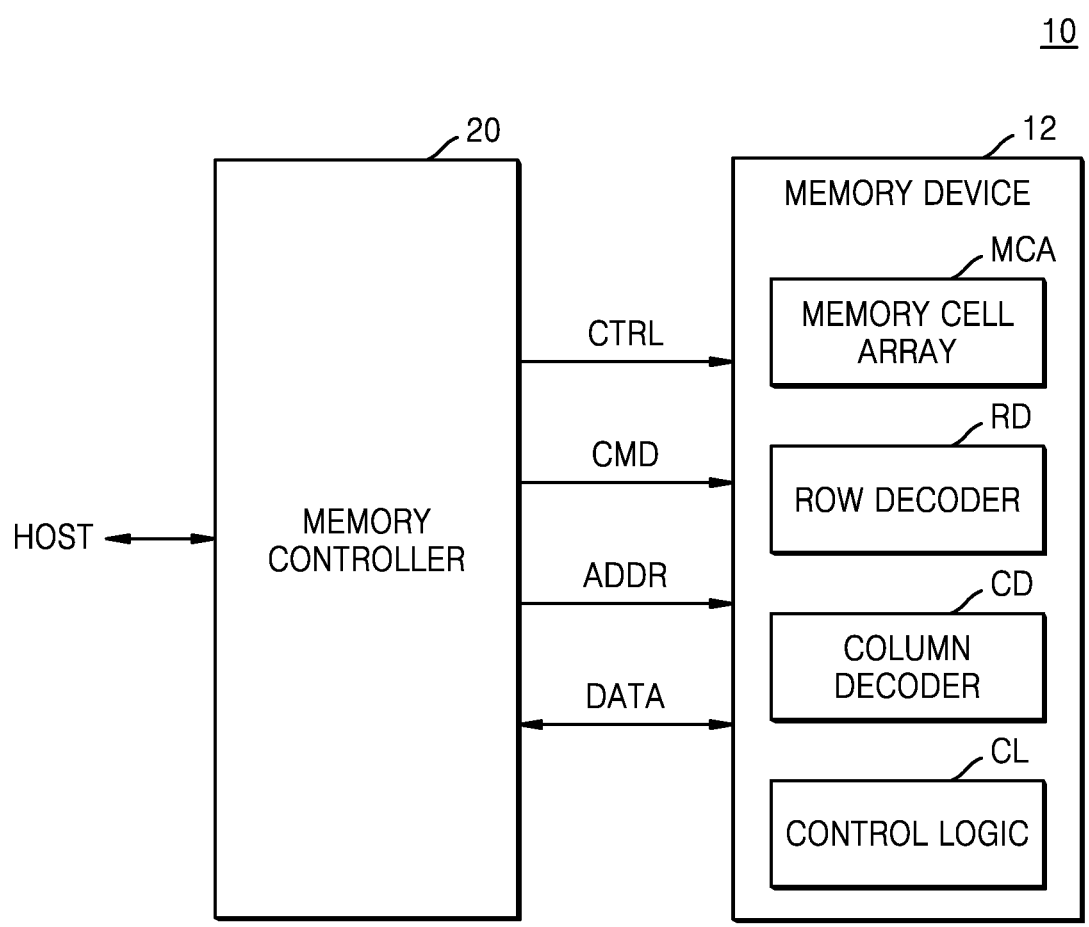
FIG. 1 is a block diagram of a memory system including a resistive memory device, according to an embodiment of the inventive concept.

Hereinafter, embodiments of the inventive concept are described in detail with reference to the accompanying drawings. In the accompanying drawings, dimensions of constituent elements may be exaggerated or reduced for clear understanding of the inventive concept. In the accompanying drawings, identical reference numerals are used for the same constituent elements and a duplicate description thereof are omitted.

FIG. 1 is a block diagram of a memory system 10 including a resistive memory device, according to an embodiment of the inventive concept.

Referring to FIG. 1, the memory system 10 may include a memory device 12 and a memory controller 20. The memory device 12 may include a memory cell array MCA, a row decoder RD, a column decoder CD, and a control logic CL.

The memory controller 20 may control the memory device 12 to read data stored in the memory device 12 or to write data to the memory device 12 in response to a write/read request from a host HOST. The memory controller 20 may control a program (or write) operation, a read operation, and an erase operation for the memory device 12 by providing an address ADDR, a command CMD, and the control signal CTRL to the memory device 12. In addition, data DATA to be written and data DATA to be read may be transmitted and received between the memory controller 20 and the memory device 12.

Figure 4:
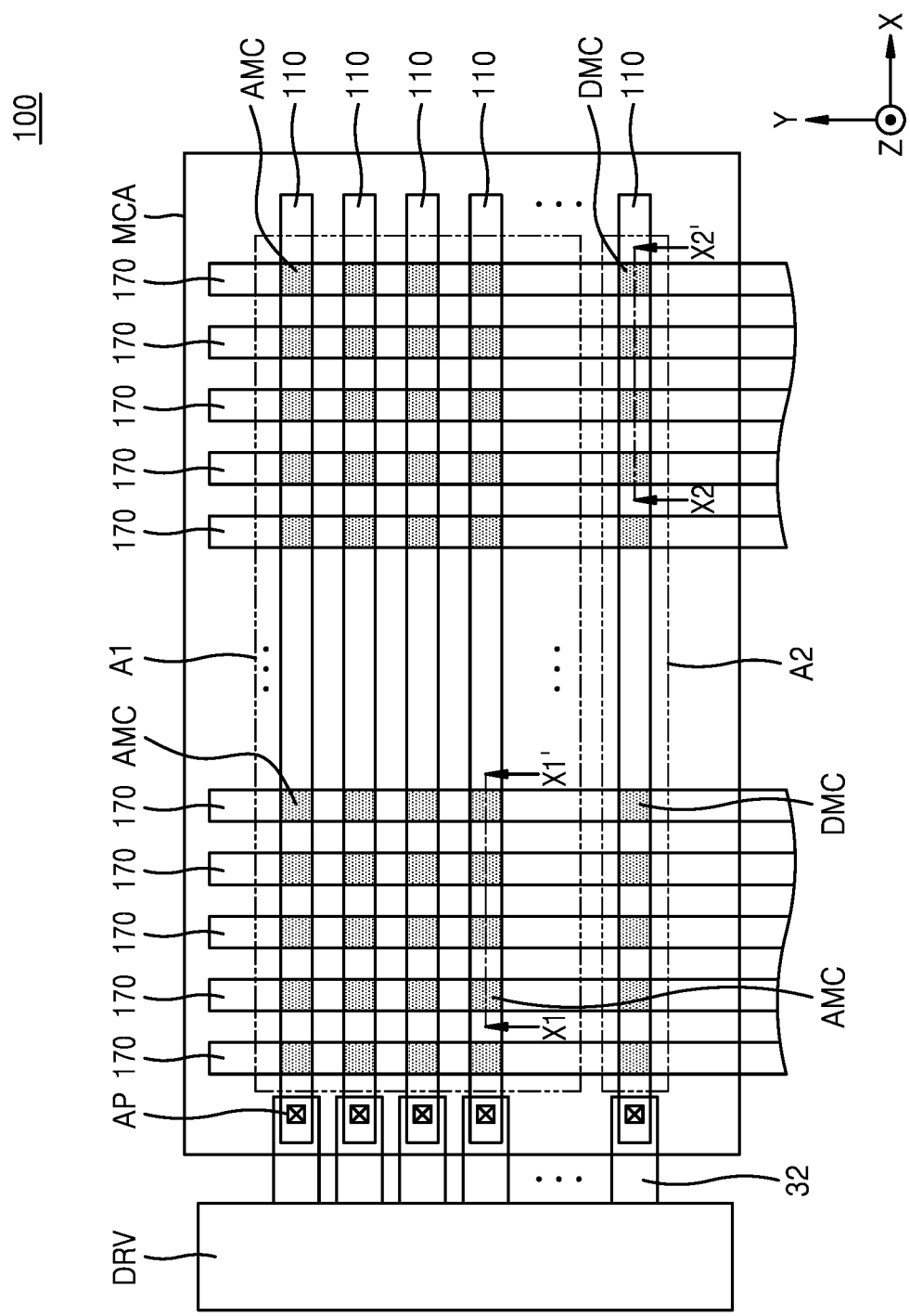
FIG. 4 is a schematic plan layout diagram of some configuration of a resistive memory device, according to an embodiment of the inventive concept.

The memory cell array MCA may include a plurality of memory cells arranged respectively in regions where a plurality of first signal lines and a plurality of second signal lines cross each other, for example, a plurality of memory cells AMC and DMC illustrated in FIG. 4. In some example embodiments, the plurality of first signal lines may include a plurality of bit lines, and the plurality of second signal lines may include a plurality of word lines. In some other embodiments, the plurality of first signal lines may include a plurality of word lines, and the plurality of second signal lines may include a plurality of bit lines.

The plurality of memory cells may each include a single level cell (SLC) storing one bit, a multi-level cell (MLC) capable of storing data of at least two bits, or a combination thereof.

Figure 3:
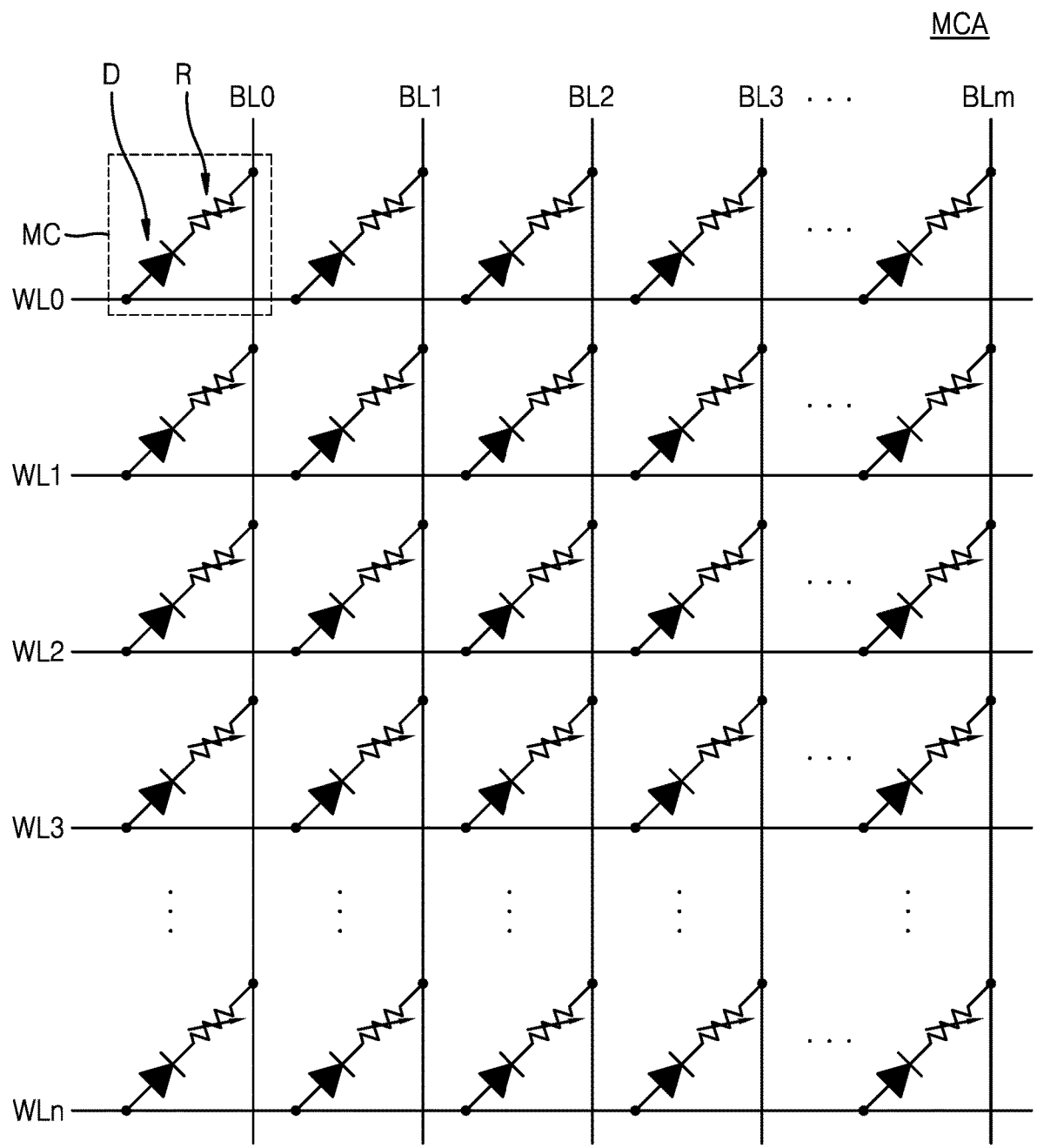
FIG. 3 is a circuit diagram of an example embodiment of a memory cell array illustrated in FIG. 2.

The memory cell array MCA may include resistive memory cells including a variable resistive element, for example, a variable memory cell including a variable resistor R illustrated in FIG. 3. In example embodiments, when the variable resistive element includes a phase change material resistance which varies with temperature, the memory device 12 may include a phase-change random-access memory (RAM) (PRAM) device.

The row decoder RD may drive the plurality of word lines constituting the memory cell array MCA, and the column decoder CD may drive the plurality of bit lines constituting the memory cell array MCA. The row decoder RD may include a decoding unit for decoding a row address, and a switch unit for controlling switching in response to various row control signals according to the decoding result. The column decoder CD may include a decoding unit for decoding a column address, and a switch unit for controlling switching in response to various column control signals according to the decoding result.

The control logic CL may control the overall operation of the memory device 12, and control the row decoder RD and the column decoder CD to perform an operation of selecting the memory cell in the memory cell array MCA. As an example, the control logic CL may process the address ADDR from the outside, and generate the row address and the column address. The memory device 12 may include a power supply unit (not illustrated) for generating various write voltages and read voltages used in write and read operations, respectively, and the write voltages and the read voltages may be provided to the memory cell via the row decoder RD and the column decoder CD under the control of the control logic CL, respectively.

Figure 2:
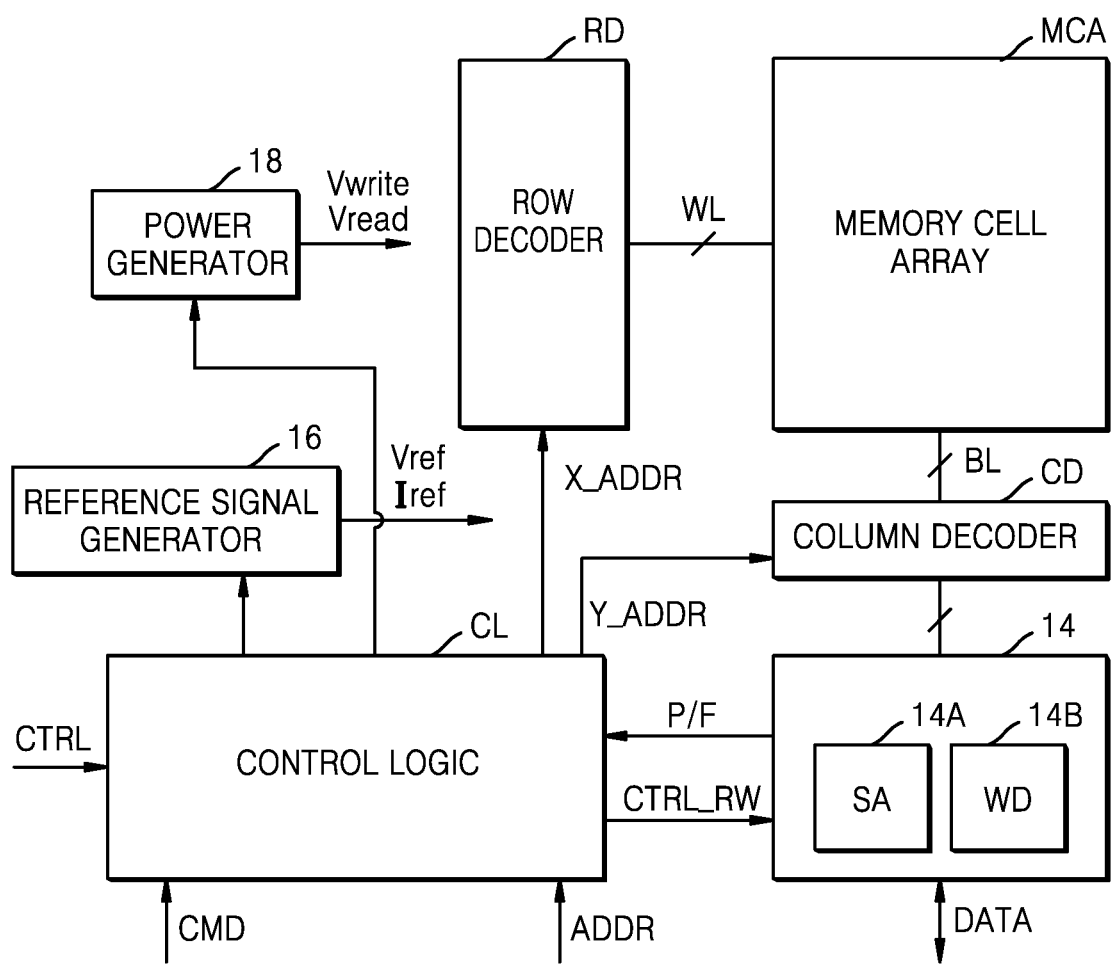
FIG. 2 is a block diagram of an example configuration of a memory device illustrated in FIG. 1.

FIG. 2 is a block diagram of an example configuration of the memory device 12 illustrated in FIG. 1.

Referring to FIG. 2, the memory device 12 may include the memory cell array MCA, the row decoder RD, the column decoder CD, and the control logic CL. In addition, the memory device 12 may further include a write/read circuit 14, a reference signal generator 16, and a power generator 18. The write/read circuit 14 may include a sense amplifier 14A and a write driver 14B.

The plurality of memory cells included in the memory cell array MCA may be connected to a plurality of word lines WL and a plurality of bit lines BL. Various voltage signals or current signals may be provided via the plurality of word lines WL and the plurality of bit lines BL, and accordingly, data may be written to or read from selected memory cells, while write or read operations for other unselected memory cells are prevented.

The address ADDR for indicating a memory cell to be accessed with the command CMD in the control logic CL may be received. The address ADDR may include a row address X_ADDR for selecting the word line WL of the memory cell array MCA, and a column address Y_ADDR for selecting the bit line BL of the memory cell array MCA. The row decoder RD may perform a word line selection operation in response to the row address X_ADDR, and the column decoder CD may perform a bit line selection operation in response to the column address Y_ADDR.

The write/read circuit 14 may be connected to the bit line BL to write data to the memory cell or to read data from the memory cell.

The power generator 18 may generate a write voltage Vwrite used for the write operation, and a read voltage Vread used for the read operation. The write voltage Vwrite may include a set voltage and a reset voltage. The write voltage Vwrite and the read voltage Vread may be provided to the bit lines BL via the column decoder CD, or to the word lines WL via the row decoder RD, respectively.

The reference signal generator 16 may generate a reference voltage Vref and a reference current Iref as various reference signals related to the data read operation.

In the write/read circuit 14, the sense amplifier 14A may be connected to a sensing node of the bit line BL to differentiate data by using the reference voltage Vref or the reference current Iref. The write/read circuit 14 may provide to the control logic CL a pass/fail signal P/F according to the differentiation result of the read data. The control logic CL may control the write and read operations of the memory cell array MCA by referring to the pass/fail signal P/F.

The control logic CL may generate various control signals CTRL_RW for writing data to the memory cell array MCA or for reading data from the memory cell array MCA, based on the address ADDR, the command CMD, and the control signal CTRL received from the memory controller 20 (refer to FIG. 1).

FIG. 3 is a circuit diagram of an example embodiment of the memory cell array MCA illustrated in FIG. 2.

Referring to FIG. 3, the memory cell array MCA may include a plurality of cell regions, and FIG. 3 may represent one cell region of the plurality of cell regions.

The memory cell array MCA may include zeroth through $n^{th}$ word lines WL0, WL1, ..., WLn, zeroth through $m^{th}$ bit lines BL0, BL1, ..., BLm, and a plurality of memory cells MC.

The zeroth through $n^{th}$ word lines WL0, WL1, ..., WLn may correspond to the word line WL in FIG. 2, and the zeroth through $m^{th}$ bit lines BL0, BL1, ..., BLm may correspond to the bit line BL in FIG. 2. Each of the plurality of memory cells MC may be at one of intersections of the zeroth through $n^{th}$ word lines WL0, WL1, ..., WLn and the zeroth through $m^{th}$ bit lines BL0, BL1, ..., BLm. The number of word lines WL, the number of bit lines BL, and the number of memory cells MC may be variously changed according to some embodiments.

Each of the plurality of memory cells MC may include the variable resistor R for storing information, and a select element D for selecting the memory cell MC. The select element D may be electrically connected to one word line of the zeroth through $n^{th}$ word lines WL0, WL1, ..., WLn, the variable resistor R may be electrically connected to one bit line of the zeroth through $m^{th}$ bit lines BL0, BL1, ..., BLm, and the variable resistor R and the select element D may be connected to each other in series. However, the technical idea of the inventive concept is not limited thereto, and the variable resistor R may be connected to one of the zeroth through $n^{th}$ word lines WL0, WL1, ..., WLn, the select element D may be connected to one of the zeroth through $m^{th}$ bit lines BL0, BL1, ..., BLm, and the variable resistor R and the select element D may be connected to each other in series.

To drive the memory device 12 (refer to FIG. 2), a voltage may be applied to the variable resistor R of the memory cell MC via the zeroth through $n^{th}$ word lines WL0, WL1, WLn and the zeroth through $m^{th}$ bit lines BL0, BL1, ..., BLm so that current flows in the variable resistor R. The variable resistor R may be changed to one of a plurality of resistance states due to an applied electrical pulse. In some embodiments, the variable resistor R may include a phase-change material in which a crystal state changes according to an amount of current. The phase-change material may be changed to an amorphous state of relatively high resistance or a crystal state of relatively low resistance. A phase of the phase-change material may be changed by Joule's heat generated according to the amount of current, and data may be written by using such phase-change.

Any memory cell MC may be addressed by selection of the zeroth through $n^{th}$ word lines WL0, WL1, ..., WLn and the zeroth through $m^{th}$ bit lines BL0, BL1, ..., BLm, and may be programmed by applying a certain signal between the selected word line WL and the selected bit line BL. In addition, by measuring a value of current flowing through the zeroth through $m^{th}$ bit lines BL0, BL1, ..., BLm, information according to a resistance value of a resistive memory layer of the corresponding memory cell MC, that is, programmed information may be read.

Figure 5A:
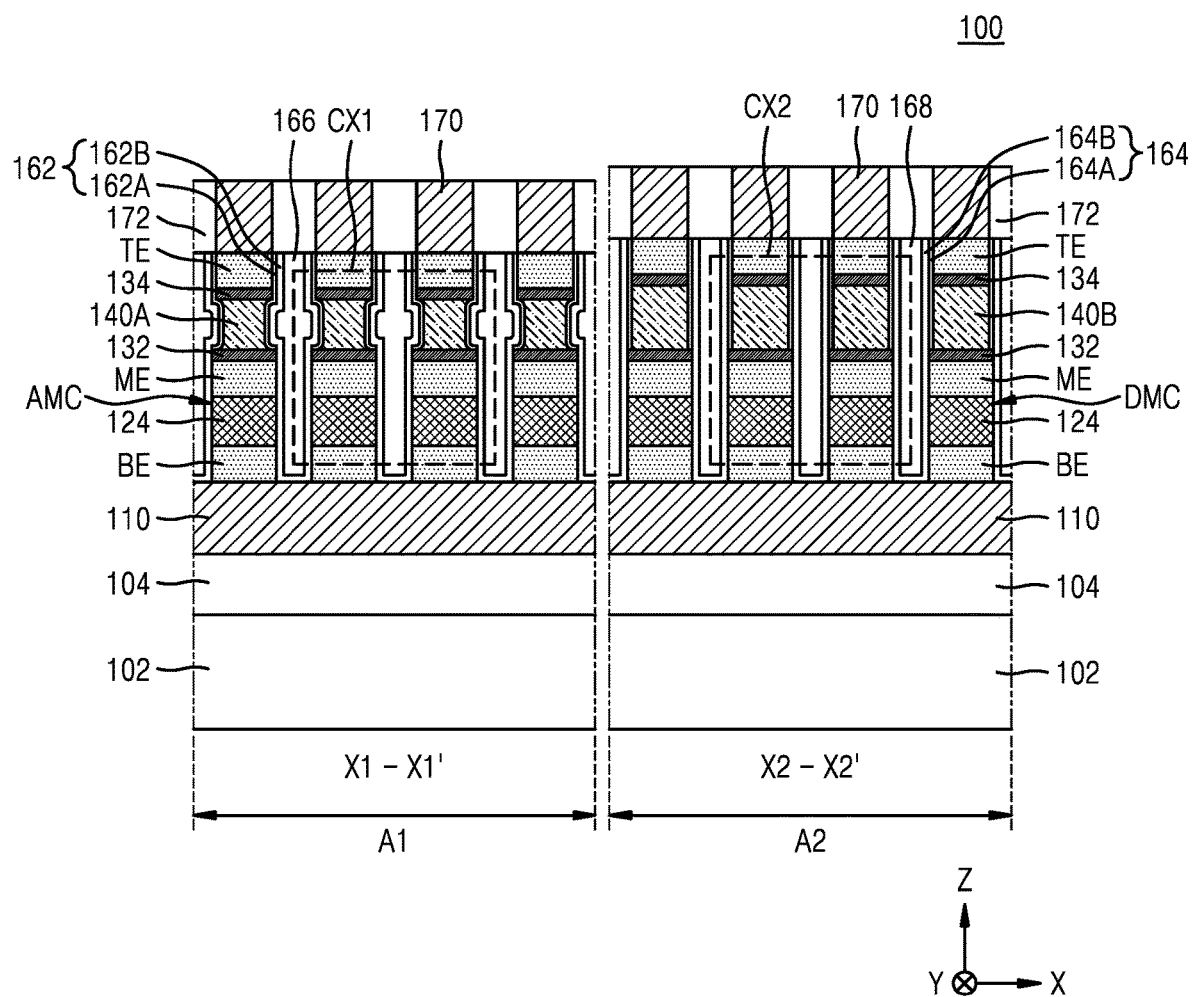
FIG. 5A is a cross-sectional view of some configuration corresponding to a cross-section taken along line X1-X1' and a cross-section taken along line X2-X2' in FIG. 4.
Figure 5B:
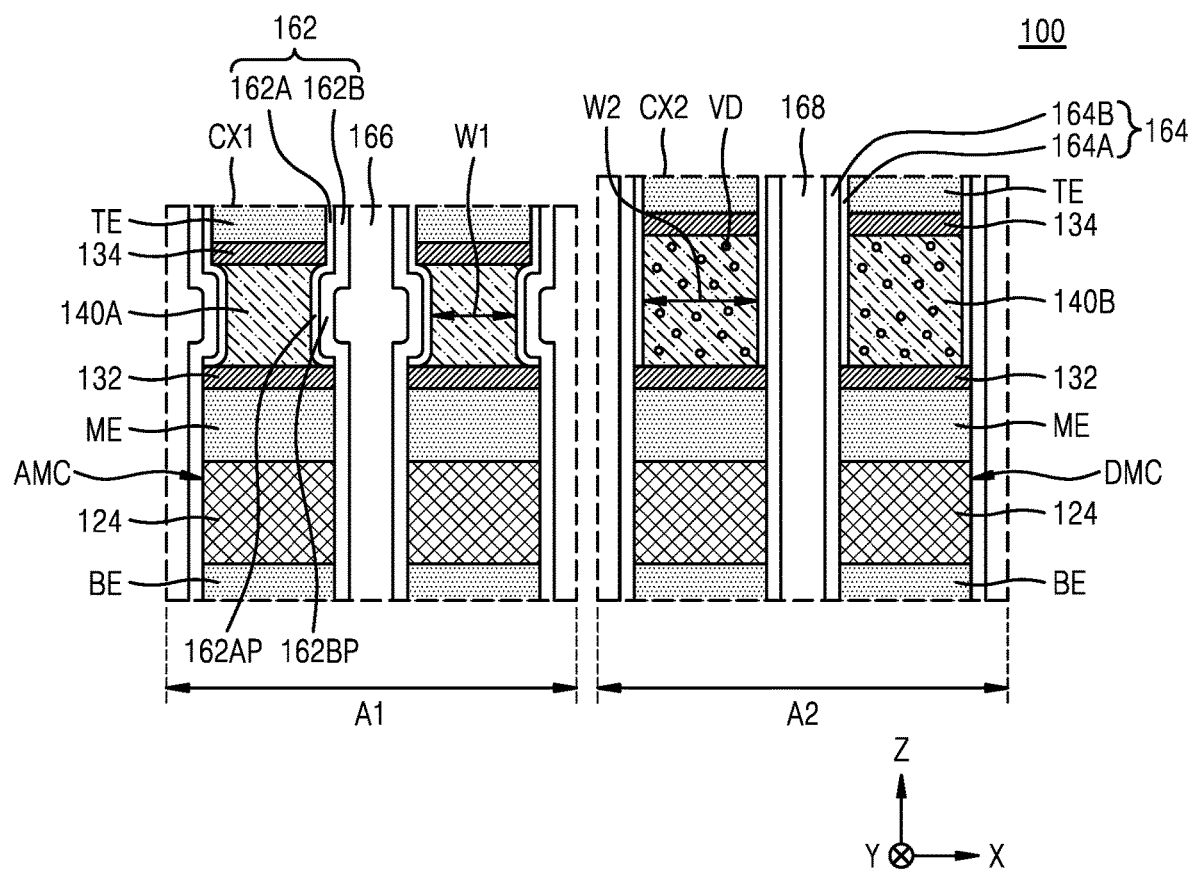
FIG. 5B is an enlarged cross-sectional view of regions indicated by CX1 and CX2 in FIG. 5A.

FIGS. 4, 5A and 5B are drawings of the resistive memory device 100, according to embodiments of the inventive concept. FIG. 4 is a schematic plan layout diagram of some configuration of a resistive memory device, according to an embodiment of the inventive concept, FIG. 5A is a cross-sectional view of some configuration corresponding to a cross-section taken along line X1-X1' and a cross-section taken along line X2-X2' in FIG. 4, and FIG. 5B is an enlarged cross-sectional view of regions indicated by CX1 and CX2 in FIG. 5A. The memory cell array MCA of the resistive memory device 100 illustrated in FIGS. 4, 5A, and 5B may have an equivalent circuit configuration described with reference to FIG. 3.

Referring to FIGS. 4, 5A, and 5B, the memory cell array MCA of the resistive memory device 100 may include a plurality of first conductive lines 110 extending in parallel to each other in a first horizontal direction (X direction) on a substrate 102, and a plurality of second conductive lines 170 extending parallel to each other in a second horizontal direction (Y direction) crossing the first direction (X direction). In the present embodiment, a case where the first horizontal direction and the second horizontal direction are orthogonal to each other is described as an example, but the technical idea of the inventive concept is not limited thereto. In some embodiments, the plurality of first conductive lines 110 may constitute the zeroth through $n^{th}$ word lines WL0, WL1, ..., WLn illustrated in FIG. 3, and the plurality of second conductive lines 170 may constitute the zeroth through $m^{th}$ bit lines BL0, BL1, ..., BLm illustrated in FIG. 3. In some other embodiments, the plurality of first conductive lines 110 may constitute the zeroth through $m^{th}$ bit lines BL0, BL1, ..., BLm illustrated in FIG. 3, and the plurality of second conductive lines 170 may constitute the zeroth through $n^{th}$ word lines WL0, WL1, ..., WLn illustrated in FIG. 3.

The plurality of memory cells MC (refer to FIG. 3) may be at a plurality of intersections between the zeroth through $n^{th}$ word lines WL0, WL1, ..., WLn and the zeroth through $m^{th}$ bit lines BL0, BL1, ..., BLm. The plurality of memory cells MC may include a plurality of active memory cells AMC and a plurality of dummy memory cells DMC. Each of the plurality of active memory cells AMC and the plurality of dummy memory cells DMC may be connected to one word line of the zeroth through $n^{th}$ word lines WL0, WL1, ..., WLn, and to one bit line of the zeroth through $m^{th}$ bit lines BL0, BL1, ..., BLm.

The memory cell array MCA may be in a first area A1 and a second area A2 on the substrate 102. The first area A1 may include an area including the plurality of active memory cells AMC, and the second area A2 may include an area including the plurality of dummy memory cells DMC. Each of the plurality of active memory cells AMC may include the memory cell MC that performs a normal operation. Each of the plurality of dummy memory cells DMC may include the memory cell MC that does not perform a normal operation.

For example, the dummy memory cells DMC may not perform program and read operations, such that the dummy memory cells DMC are not used as data storage elements.

In example embodiments, the second area A2 on which the plurality of dummy memory cells DMC are arranged may include an edge area of the memory cell array MCA. In other example embodiments, the second area A2 on which the plurality of dummy memory cells DMC are arranged may include a periphery area of an area penetrated by a contact plug (not illustrated) in the memory cell array MCA. The first area A1 and the second area A2 illustrated in FIG. 4 are arbitrarily defined, and ranges and planar shapes of the first area A1 and the second area A2 are not limited thereto. The range and the planar shape of each of the first area A1 and the second area A2 in the memory cell array MCA may be variously set according to the electrical characteristics or circuit arrangement required by the memory device 100.

An interlayer insulating layer 104 may be on the substrate 102. The interlayer insulating layer 104 may include an oxide layer, a nitride layer, or a combination thereof.

The plurality of first conductive lines 110 may be connected to a driver DRV. The driver DRV may include a circuit for applying a voltage to the plurality of first conductive lines 110, and may include, for example, the row decoder RD described with reference to FIG. 2. The driver DRV may apply a voltage to an access point AP of each of the plurality of first conductive lines 110 via wirings 32. When a set write operation is performed, a voltage may be applied via the selected first conductive line 110 and the selected second conductive line 170, to which the selected memory cell MC, for example, the active memory cell AMC or the dummy memory cell DMC, is connected. For example, by applying a set high voltage to the selected first conductive line 110 via the access point AP, and a set low voltage, less than the set high voltage, to the selected second conductive line 170, a voltage corresponding to a potential difference between the set high voltage and the set low voltage may be applied to both ends of the selected memory cell MC, and the set current may flow through the selected memory cell MC, and accordingly, a current may flow through the plurality of first conductive lines 110 and the plurality of second conductive lines 170.

A plurality of first insulating patterns 112 may be between each of the plurality of first conductive lines 110, and a plurality of second insulating patterns 172 may be between each of the plurality of second conductive lines 170. The plurality of first and second insulating patterns 112 and 172 may include a silicon oxide layer, a silicon nitride layer, or a combination thereof.

Each of the plurality of first and second conductive lines 110 and 170 may include a metal, a conductive metal nitride, a conductive metal oxide, or a combination thereof. In some embodiments, the plurality of first and second conductive lines 110 and 170 may include or may be formed of at least one of W, Ti, Ta, Al, Cu, C, CN, TiN, TiAlN, TiSiN, TiCN, TiCSiN, WN, CoSiN, WSiN, TaN, TaCN, TaSiN, Au, Ag, Ir, Pt, Pd, Ru, Zr, Rh, Ni, Co, Cr, Sn, Zn, indium tin oxide (ITO), or a combination thereof. The plurality of first and second conductive lines 110 and 170 may further include a conductive barrier layer. The conductive barrier layer may include or may be formed of, for example, Ti, TiN, Ta, TaN, or a combination thereof.

The plurality of active memory cells AMC and the plurality of dummy memory cells DMC, which are at a plurality of intersection points between the plurality of first and second conductive lines 110 and 170, may be insulated from each other by an insulating layer. The insulating layer may include a plurality of first encapsulation insulating layers 162 and a plurality of first gap fill insulating layers 166 filling a space between each of the plurality of active memory cells AMC in the first area A1, and a plurality of second encapsulation insulating layers 164 and a plurality of second gap fill insulating layers 168 filling a space between each of the plurality of dummy memory cells DMC in the second area A2.

In the first area A1, each of the plurality of active memory cells AMC may include a lower electrode BE, a select element 124, a middle electrode ME, and a lower barrier 132, a first resistive memory pattern 140A, an upper barrier 134, and an upper electrode TE, which are sequentially stacked on the first conductive line 110. In the second area A2, each of the plurality of dummy memory cells DMC may include the lower electrode BE, the select element 124, the middle electrode ME, the lower barrier 132, a second resistive memory pattern 140B, the upper barrier 134, and the upper electrode TE, which are sequentially stacked on the first conductive line 110.

In the plurality of active memory cells AMC and the plurality of dummy memory cells DMC, the lower electrode BE, the middle electrode ME, and the upper electrode TE may each include a metal, a conductive metal nitride, a conductive metal oxide, or a combination thereof. For example, each of the bottom electrode BE, the middle electrode ME, and the upper electrode TE may include or may be formed of one of W, Ti, Ta, Al, Cu, C, CN, TiN, TiAlN, TiSiN, TiCN, TiCSiN, WN, CoSiN, WSiN, TaN, TaCN, and TaSiN, or a combination thereof, but is not limited thereto.

In the plurality of active memory cells AMC and the plurality of dummy memory cells DMC, the select element 124 may include a chalcogenide switching material in an amorphous state. The select element 124 may include a material layer resistance which varies according to a magnitude of a voltage applied at both ends of the select element 124. For example, the select element 124 may include an Ovonic threshold switching (OTS) material. The OTS material may include or may be formed of a chalcogenide switching material. In example embodiments, the select element 124 may include a single layer or a multi-layer including one of a two-component material such as GeSe, GeS, AsSe, AsTe, AsS, SiTe, SiSe, SiS, GeAs, SiAs, SnSe, and SnTe, a three-component material such as GeAsTe, GeAsSe, AlAsTe, AlAsSe, SiAsTe, SiAsTe, GeSeTe, GeSeSb, GaAsSe, GaAsTe, InAsSe, InAsTe, SnAsSe, and SnAsTe, a four-component material such as GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, and GeAsTeZn, a five-component material such as GeSiAsSeTe, GeAsSeTeS, GeSiAsSeS, GeSiAsTeS, GeSiSeTeS, GeSiAsSeP, GeSiAs-TeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeSTl, GeAsSeSZn, GeAsSeSSn, GeAsTeSIn, GeAsTeSGa, GeAsTeSZn, GeAsT-eSSn, GeAsSeInGa, GeAsSeInAl, GeAsSeInTl, GeAsSeInZn, GeAsSeZnSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, and GeAsSeZnSn, and a six-component material such as GeSiAs- SeTeS, GeSiAsSeTeIn, GeSiAsSeTeGa, GeSiAsSeTeAl, GeSiAsSeTeTl, GeSiAsSeTeZn, GeSiAsSeTeSn, GeSiAsSeTeP, GeSiAsSeSIn, GeSiAsSeSGa, GeSiAsSeSAl, GeSiAsSeSTl, GeSiAsSeSZn, GeSiAsSeSSn, GeAsSeTeSIn, GeAsSeTeSGa, GeAsSeTeSAl, GeAsSeTeSTl, GeAsSeTeSZn, GeAsSeTeSSn, GeAsSeTePIn, GeAsSeTePGa, GeAsSeTePAl, GeAsSeTePTl, GeAsSeTePZn, GeAsSeTePSn, GeSiAsSeInGa, GeSiAsSeInAl, GeSiAsSeInTl, GeSiAsSeInZn, GeSiAsSeInSn, GeSiAsSeGaAl, GeSiAsSeGaTl, GeSiAsSeGaZn, GeSiAsSeGaSn, GeSiAsSeAlSn, GeAsSeTeInGa, GeAsSeTeInAl, GeAsSeTeInTl, GeAsSeTeInZn, GeAsSeTeInSn, GeAsSeTeGaAl, GeAsSeTeGaTl, GeAsSeTeGaZn, GeAsSeTeGaSn, GeAsSeTeAlSn, GeAsSeSInGa, GeAsSeSInAl, GeAsSeSInTl, GeAsSeSInZn, GeAsSeSInSn, GeAsSeSGaAl, GeAsSeSGaTl, GeAsSeSGaZn, GeAsSeSGaSn, and GeAsSeSAlSn.

In other example embodiments, the select element 124 may include, as a constituent material thereof, at least one of the two-component through six-material component materials described above, and at least one additional element of B, C, N, and O.

The first resistive memory pattern 140A and the second resistive memory pattern 140B may include a phase change material that reversibly changes between an amorphous state and a crystalline state according to a heating time. For example, the phases of the first resistive memory pattern 140A and the second resistive memory pattern 140B may be reversibly changed by Joule heat generated by a voltage applied to both ends thereof, and may include a material resistance which is changed by the phase change. In example embodiments, each of the first resistive memory pattern 140A and the second resistive memory pattern 140B may include or may be formed of a chalcogenide material as a phase change material. In example embodiments, each of the first resistive memory pattern 140A and the second resistive memory pattern 140B may include a single layer or a multi-layer including a material of two-component materials such as GeTe, GeSe, GeS, SbSe, SbTe, SbS, SbSe, SnSb, InSe, InSb, AsTe, AlTe, GaSb, AlSb, BiSb, ScSb, Ysb, CeSb, DySb, and NdSb, three-component materials such as GeSbSe, AlSbTe, AlSbSe, SiSbSe, SiSbTe, GeSeTe, InGeTe, GeSbTe, GeAsTe, SnSeTe, GeGaSe, BiSbSe, GaSeTe, InGeSb, GaSbSe, GaSbTe, InSbSe, InSbTe, SnSbSe, SnSbTe, ScSbTe, ScSbSe, ScSbS, YSbTe, YSbSe, YSbS, CeSbTe, CeSbSe, CeSbS, DySbTe, DySbSe, DySbS, NdSbTe, NdSbSe, and NdSbS, four-component materials such as GeSbTeS, BiSbTeSe, AgInSbTe, GeSbSeTe, GeSnSbTe, SiGeSbTe, SiGeSbSe, SiGeSeTe, BiGeSeTe, BiSiGeSe, BiSiGeTe, GeSbTeBi, GeSbSeBi, GeSbSeIn, GeSbSeGa, GeSbSeAl, GeSbSeTl, GeSbSeSn, GeSbSeZn, GeSbTeIn, GeSbTeGa, GeSbTeAl, GeSbTeTl, GeSbTeSn, GeSbTeZn, ScGeSbTe, ScGeSbSe, ScGeSbS, YGeSbTe, YGeSbSe, YGeSbS, CeGeSbTe, CeGeSbSe, CeGeSbS, DyGeSbTe, DyGeSbSe, DyGeSbS, NdGeSbTe, NdGeSbSe, and NdGeSbS, and five-component materials such as InSbTeAsSe, GeScSbSeTe, GeSbSeTeS, GeScSbSeS, GeScSbTeS, GeScSeTeS, GeScSbSeP, GeScSbTeP, GeSbSeTeP, GeScSbSeIn, GeScSbSeGa, GeScSbSeAl, GeScSbSeTl, GeScSbSeZn, GeScSbSeSn, GeScSbTeIn, GeScSbTeGa, GeSbAsTeAl, GeScSbTeTl, GeScSbTeZn, GeScSbTeSn, GeSbSeTeIn, GeSbSeTeGa, GeSbSeTeAl, GeSbSeTeTl, GeSbSeTeZn, GeSbSeTeSn, GeSbSeSIn, GeSbSeSGa, GeSbSeSAl, GeSbSeSTl, GeSbSeSZn, GeSbSeSSn, GeSbTeSIn, GeSbTeSGa, GeSbTeSAl, GeSbTeSTl, GeSbTeSZn, GeSbTeSSn, GeSbSeInGa, GeSbSeInAl, GeSbSeInTl, GeSbSeInZn, GeSbSeInSn, GeSbSeGaAl, GeSbSeGaTl, GeSbSeGaZn, GeSbSeGaSn, GeSbSeAlTl, GeSbSeAlZn, GeSbSeAlSn, GeSbSeTlZn, GeSbSeTlSn, and GeSbSeZnSn.

In other example embodiments, each of the first resistive memory pattern 140A and the second resistive memory pattern 140B may include a material of the two-component materials through five-component materials described above as a constituent material of the first resistive memory pattern 140A and the second resistive memory pattern 140B, and may include at least one additional element of B, C, N, O, P, Cd, W, Ti, Hf, and Zr.

A bottom surface of each of the first and second resistive memory patterns 140A and 140B may be in contact with the lower barrier 132, and a top surface of each of the first and second resistive memory patterns 140A and 140B may be in contact with the upper barrier 134. Each of the lower barrier 132 and the upper barrier 134 may include or may be formed of a conductive material such as W, WN, WC, or a combination thereof, but is not limited thereto.

As illustrated in FIG. 5B, the second resistive memory pattern 140B may include a void region VD. In example embodiments, the first resistive memory pattern 140A may not include the void region VD. In other example embodiments not illustrated, the first resistive memory pattern 140A may include the void region VD, but the total volume of the void region VD included in the first resistive memory pattern 140A may be less than the total volume of the void region VD included in the second resistive memory pattern 140B.

In example embodiments, the density of the phase change material constituting the first resistive memory pattern 140A may be greater than the density of the phase change material constituting the second resistive memory pattern 140B. In example embodiments, a volume of the first resistive memory pattern 140A in the first area A1 may be less than a volume of the second resistive memory pattern 140B in the second area A2.

The first resistive memory pattern 140A in the first area A1 may have a first width W1 in the first horizontal direction (X direction). The second resistive memory pattern 140B in the second area A2 may have a second width W2 in the first horizontal direction (X direction). The first width W1 may be less than the second width W2. In FIGS. 5A and 5B, cross-sectional configurations of the first resistive memory pattern 140A and the second resistive memory pattern 140B in the first horizontal direction (X direction) are illustrated, but cross-sectional configurations thereof in the second horizontal direction (Y direction) may be the same as or similar to the cross-sectional configuration in the first horizontal direction (X direction), and the width W1 of the first resistive memory pattern 140A may be less than the width W2 of the second resistive memory pattern 140B in the second horizontal direction (Y direction). For example, the width of the first resistive memory pattern 140A in the horizontal direction (for example, X direction or Y direction) may be about 80% to about 95% of the width of the second resistive memory pattern 140B in the horizontal direction (for example, X direction or Y direction), but is not limited thereto. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

In the first area A1, a horizontal separation distance between each of the plurality of first resistive memory patterns 140A included in the plurality of active memory cells AMC may be greater than a horizontal separation distance between each of the respective plurality of upper barriers 134 and may be greater than a horizontal separation distance between each of the respective upper electrodes TE included in the plurality of active memory cells AMC. Also, in the first area A1, a horizontal separation distance between each of the plurality of first resistive memory patterns 140A included in the plurality of active memory cells AMC may be greater than a horizontal separation distance between each of the respective plurality of lower barriers 132, may be greater than a horizontal separation distance between each of the respective middle electrodes ME, may be greater than a horizontal separation distance between each of the respective plurality of select elements 124, and may be greater than a horizontal separation distance between each of the respective plurality of bottom elements BE included in the plurality of active memory cells AMC.

In the vertical direction (Z direction), perpendicular to the substrate 102, a height of the first resistive memory pattern 140A in the first area A1 may be less than a height of the second resistive memory pattern 140B in the second area A2. For example, the height of the first resistive memory pattern 140A in the vertical direction (Z direction) may be about 80% to about 95% of the height of the second resistive memory pattern 140B in the vertical direction (Z direction), but is not limited thereto.

In the first horizontal direction (X direction) and the second horizontal direction (Y direction), parallel to the substrate, widths of each of the first and second resistive memory patterns 140A and 140B may be less than a width of each of the lower electrode BE, the select element 124, and the middle electrode ME. In the first area A1, a difference between a horizontal width of the first resistive memory pattern 140A and a horizontal width of each of the lower electrode BE, the select element 124, and the middle electrode ME may be greater than a difference between a horizontal width of the second resistive memory pattern 140B and a horizontal width of each of the lower electrode BE, the select element 124, and the middle electrode ME.

In the horizontal direction (for example, X direction or Y direction), a width of the first resistive memory pattern 140A of the active memory cell AMC in the first area A1 may be less than a width of each of the lower barrier 132 and the upper barrier 134, which contact the bottom surface and the top surface of the first resistive memory pattern 140A, respectively.

A space between adjacent active memory cells AMC of the plurality of active memory cells AMC in the first area A1 may be filled with a plurality of first encapsulation insulating layers 162, that may each include an internal liner 162A and an external liner 162B, and a gap fill insulating layer 166. For example, in the first area A1, in a space between the upper electrode TE, the upper barrier 134, and the first resistive memory pattern 140A of adjacent ones of the plurality of active memory cells AMC, the first encapsulation insulating layers 162 may include both the internal liner 162A and the external liner 162B. In the first area A1, in a space between adjacent ones of the plurality of active memory cells AMC that is not between the upper electrode TE, the upper barrier 134, and the first resistive memory pattern 140A of the active memory cells AMC, the encapsulation insulating layers 162 may include only the external liner 162B.

A space between each of the plurality of dummy memory cells DMC in the second area A2 may be filled with a plurality of second encapsulation insulating layers 164, that may each include an internal liner 162A and an external liner 162B, and a second gap fill insulating layer 168. For example, in the second area A2, in a space between the upper electrode TE, the upper barrier 134, and the second resistive memory pattern 140B of the dummy memory cells DMC, the second encapsulation insulating layers 164 may include both the internal liner 164A and the external liner 164B. In the second area A2, in a space between adjacent ones of the plurality of dummy memory cells DMC that is not between the upper electrode TE, the upper barrier 134, and the second resistive memory pattern 140B of the dummy memory cells DMC, the encapsulation insulating layers 164 may include only the external liner 164B.

In the first area A1, a sidewall of each of the plurality of active memory cells AMC may be in contact with the first encapsulation insulating layer 162, and the first gap fill insulating layer 166 may be apart from the active memory cell AMC with the first encapsulation insulating layer 162 therebetween. In the second area A2, a sidewall of each of the plurality of dummy memory cells DMC may be in contact with the second encapsulation insulating layer 164, and the second gap fill insulating layer 168 may be apart from the dummy memory cell DMC with the second encapsulation insulating layer 164 therebetween.

In example embodiments, each of the plurality of first encapsulation insulating layers 162 and the plurality of second encapsulation insulating layers 164 may not include carbon (C) atoms. Each of the plurality of first encapsulation insulating layers 162 may include an internal liner 162A and an external liner 162B. The internal liner 162A and the external liner 162B may include different insulating materials from each other. Each of the plurality of second encapsulation insulating layers 164 may include an internal liner 164A and an external liner 164B. The internal liner 164A and the external liner 164B may include different insulating materials from each other. For example, the internal liners 162A and 164A may include or may be formed of a silicon oxide layer, and the external liners 162B and 164B may include or may be formed of a silicon nitride layer, a silicon oxynitride layer, or a combination thereof.

In example embodiments, at least some of each of the plurality of first and second encapsulation insulating layers 162 and 164 may include a material shrinkable by annealing or Joule heating. Each of the plurality of first encapsulation insulating layers 162 and the plurality of second encapsulation insulating layers 164 may include a dangling bond region or a porous region before application of heat by annealing or Joule heating. After application of heat to the plurality of first encapsulation insulating layers 162 and the plurality of second encapsulation insulating layers 164 by annealing or Joule heating, additional bonding may be performed in the dangling bond region or the porous region by heat, and thus, a material having a denser and stronger structure may be formed. In example embodiments, the external liner 162B included in the first encapsulation insulating layer 162 and the external liner 164B included in the second encapsulation insulating layer 164 may include a material containing the same elements. However, the external liner 162B included in the first encapsulation insulating layer 162 may have a more dense and rigid structure than the external liner 164B included in the second encapsulation insulating layer 164.

In the first area A1, the internal liner 162A and the external liner 162B constituting the first encapsulation insulating layer 162 may include protrusions 162AP and 162BP that protrude convexly toward the first resistive memory pattern 140A. In the second area A2, each of the internal liner 164A and the external liner 164B constituting the second encapsulation insulating layer 164 may not include portions that protrude convexly toward the second resistive memory pattern 140B.

Each of the plurality of first gap fill insulating layers 166 and the plurality of second gap fill insulating layers 168 may have a greater thermal expansion coefficient than a constituent material of each of the plurality of first encapsulation insulating layers 162 and the plurality of second encapsulation insulating layers 164, respectively. For example, each of the plurality of first gap fill insulating layers 166 and the plurality of second gap fill insulating layers 168 may include or may be formed of SiOC, SiOCH, SiOH, hydrogen silsesquioxane-based flowable oxide (HSQ), aluminum oxide, aluminum nitride, zirconium oxide, strontium oxide, lanthanum oxide, yttrium oxide, or a combination thereof. The HSQ may include a material represented by a chemical formula $(H_2Si_2O_3)_n$ (n is an integer of 3 to 8). For example, the thermal expansion coefficient of the HSQ layer may be about 18.5 ppm/° C., the thermal expansion coefficient of an SiOC layer may be about 13 ppm/° C., and the thermal expansion coefficient of an SiOCH layer may be about 17 ppm/° C. to about 18 ppm/° C. These layers may include materials having a greater thermal expansion coefficient than a silicon dioxide layer having a thermal expansion coefficient of about 1 ppm/° C., and may be suitable for use as a constituting material of the plurality of first gap fill insulating layers 166 and the plurality of second gap fill insulating layers 168.

In example embodiments, each of the plurality of first gap fill insulating layers 166 and the plurality of second gap fill insulating layers 168 may include C atoms. In this case, the content of C atoms in the plurality of first gap fill insulating layers 166 and the plurality of second gap fill insulating layers 168 may be about 1 atomic % to about 30 atomic %. For example, each of the plurality of first gap fill insulating layers 166 and the plurality of second gap fill insulating layers 168 may include an SiOC layer having a content of the C atoms of about 1 atomic % to about 30 atomic %, an SiOCH layer having a content of the C atoms of about 1 atomic % to about 30 atomic %, or a combination thereof.

In the first area A1, the width of each of the plurality of first gap fill insulating layers 166 in the horizontal direction (X direction or Y direction) may vary when traversing the vertical direction (Z direction). In example embodiments, a width of a portion facing the first resistive memory pattern 140A of the active memory cell AMC in each of the plurality of first gap fill insulating layers 166 may be greater than a width of portions facing other components except the first resistive memory pattern 140A of the active memory cell AMC in each of the plurality of first gap fill insulating layers 166. For example, the width of the portion of the first gap fill insulating layer 166 facing the first resistive memory pattern 140A in the horizontal direction (X direction or Y direction) may be greater than a width of the portion of the first gap fill insulating layer 166 facing the upper electrode TE, which is arranged farther than the first resistive memory pattern 140A from the substrate 102.

In the second area A2, the width of each of the plurality of first gap fill insulating layers 168 in the horizontal direction (X direction or Y direction) may be substantially constant when traversing the vertical direction (Z direction). In example embodiments, a width of the portion of the second gap fill insulating layer 168 facing the second resistive memory pattern 140B in the horizontal direction (X direction or Y direction) may not be greater than a width of the portion thereof facing the upper electrode TE, which is arranged farther than the second resistive memory pattern 140B from the substrate 102.

Figure 6:
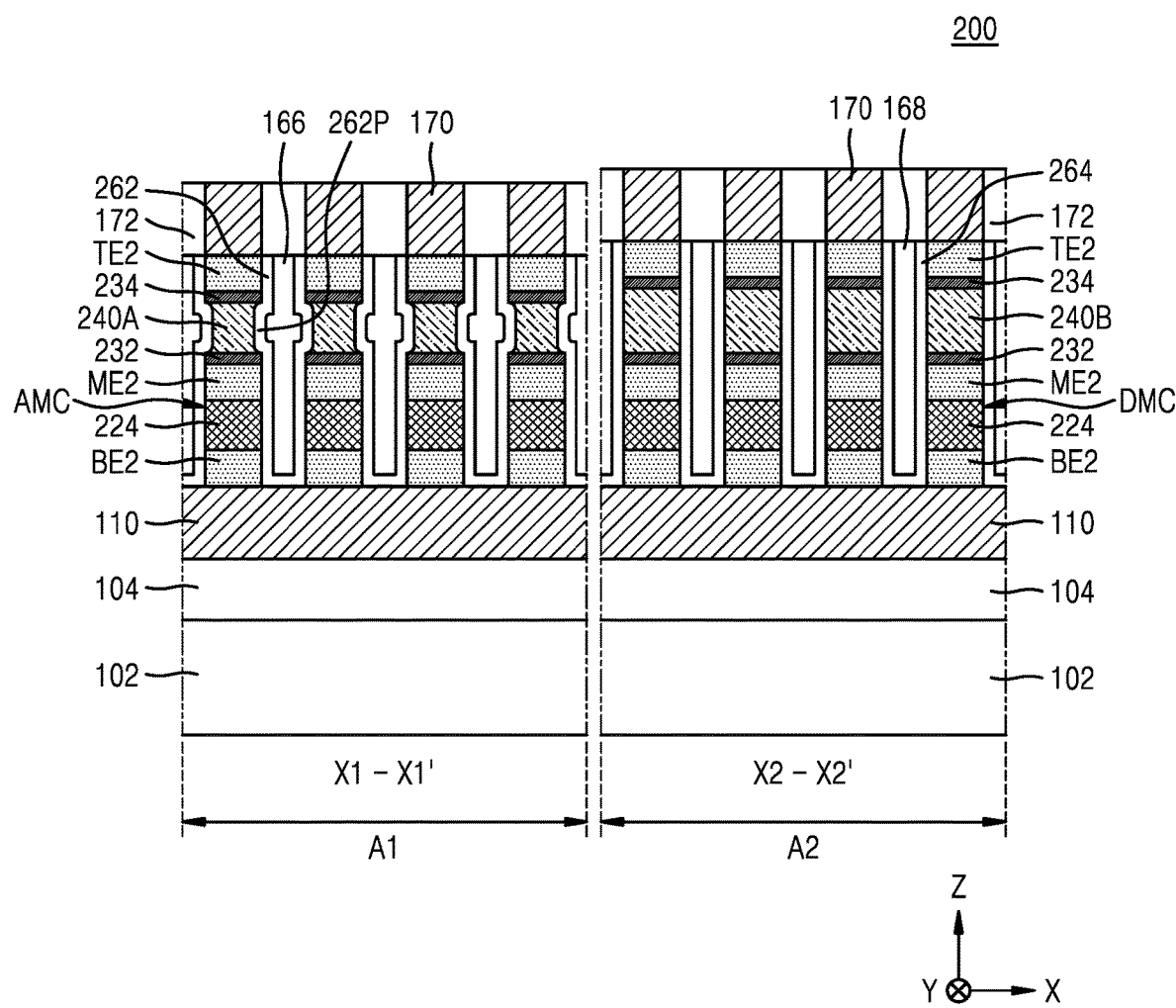
FIG. 6 is a cross-sectional view of a resistive memory device according to another embodiment of the inventive concept.

FIG. 6 is a cross-sectional view of a resistive memory device 200 according to another embodiment of the inventive concept. In FIG. 6, the same reference numerals as in FIGS. 4, 5A, and 5B may denote the same members, and a repeated description thereof is omitted. FIG. 6 illustrates some components of the portions corresponding to cross-sections taken along lines X1-X1' and X2-X2' in FIG. 4. The resistive memory device 200 illustrated in FIG. 6 may have substantially the same or similar plan layout as illustrated in FIG. 4.

Referring to FIG. 6, the resistive memory device 200 may have substantially the same configuration as that of the resistive memory device 100 described with reference to FIGS. 4, 5A, and 5B. However, the resistive memory device 200 may include a plurality of first encapsulation insulating layers 262 instead of the plurality of first encapsulation insulating layers 162 in the first area A1, and may include a plurality of second encapsulation insulating layers 264 instead of the plurality of second encapsulation insulating layers 164 in the second area A2. The first encapsulation insulating layers 262 and the second encapsulation insulating layers 264 may be homogenous structures. Each of the first encapsulation insulating layers 262 may be formed at the same time and of the same material, without a break in the continuity of the material of which they are formed. Each of the second encapsulation insulating layers 264 may be formed at the same time and of the same material, without a break in the continuity of the material of which they are formed. For example, in contrast to the first encapsulation insulating layers 162 and the second encapsulation insulating layers 164, the first encapsulation insulating layers 262 and the second encapsulation insulating layers 264 may not include separate internal liners 162A and external liners 162B or separate internal liners 164A and 164B. In the first area A1 of the resistive memory device 200, the plurality of active memory cells AMC may include a lower electrode BE2, a select element 224, a middle electrode ME2, a lower barrier 232, a first resistive memory pattern 240A, an upper barrier 234, and an upper electrode TE2, which are sequentially stacked on the first conductive line 110. In the second area A2 of the resistive memory device 200, the plurality of dummy memory cells DMC may include the lower electrode BE2, the select element 224, the middle electrode ME2, the lower barrier 232, a second resistive memory pattern 240B, the upper barrier 234, and the upper electrode TE2, which are sequentially stacked on the first conductive line 110.

Detailed descriptions of the lower electrode BE2, the select element 224, the middle electrode ME2, the lower barrier 232, the first resistive memory pattern 240A, the second resistive memory pattern 240B, the upper barrier 234, and the upper electrode TE2 may be substantially the same as descriptions given with reference to FIGS. 4, 5A, and 5B of the lower electrode BE, the select element 124, the middle electrode ME, the lower barrier 132, and the first resistive memory pattern 140A, the second resistive memory pattern 140B, the upper barrier 134, and the upper electrode TE. However, a width in the horizontal direction of each of the lower electrode BE2, the select element 224, the middle electrode ME2, and the lower barrier 232 may be less than the width in the horizontal direction of each of the lower electrode BE, the select element 124, the middle electrode ME, and the lower barrier 132, which have been described with reference to FIGS. 4, 5A, and 5B.

The plurality of first encapsulation insulating layers 262 and the plurality of second encapsulation insulating layers 264 may include a material shrinkable by annealing or Joule heating. Each of the plurality of first encapsulation insulating layers 262 and the plurality of second encapsulation insulating layers 264 may include the dangling bond region or the porous region before application of heat by annealing or Joule heating, and after application of heat by annealing or Joule heating, additional bonding may be performed in the dangling bond region or the porous region by heat, and thus, a material having a denser and stronger structure may be formed. In example embodiments, the first encapsulation insulating layer 262 and the second encapsulation insulating layer 264 may include a material including the same elements, but the first encapsulation insulating layer 262 may have a denser and stronger structure than the second encapsulation insulating layer 264. For example, each of the plurality of first encapsulation insulating layers 262 and the plurality of second encapsulation insulating layers 264 may include or may be formed of a silicon nitride layer, a silicon oxynitride layer, or a combination thereof.

In the first area A1, each of the plurality of first encapsulation insulating layers 262 may include a protrusion 262P convexly protruding toward the first resistive memory pattern 240A. In the horizontal direction (for example, X direction or Y direction), a width of the first resistive memory pattern 240A of the active memory cell AMC in the first area A1 may be less than a width of each of the lower barrier 232 and the upper barrier 234, which contact the bottom surface and the top surface of the first resistive memory pattern 240A, respectively.

In the second area A2, each of the plurality of second encapsulation insulating layers 264 may not include a protrusion convexly protruding toward the second resistive memory pattern 240B. In the horizontal direction (for example, X direction or Y direction), a width of the second resistive memory pattern 240B of the dummy memory cell DMC in the second area A2 may be substantially the same as a width of each of the lower barrier 232 and the upper barrier 234, which contact the bottom surface and the top surface of the second resistive memory pattern 240B, respectively. More detailed descriptions of the plurality of first encapsulation insulating layers 262 and the plurality of second encapsulation insulating layers 264 may be substantially the same as descriptions given with reference to FIGS. 4, 5A, and 5B of the plurality of first encapsulation insulating layers 162 and the plurality of second encapsulation insulating layers 164. Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

Figure 7:
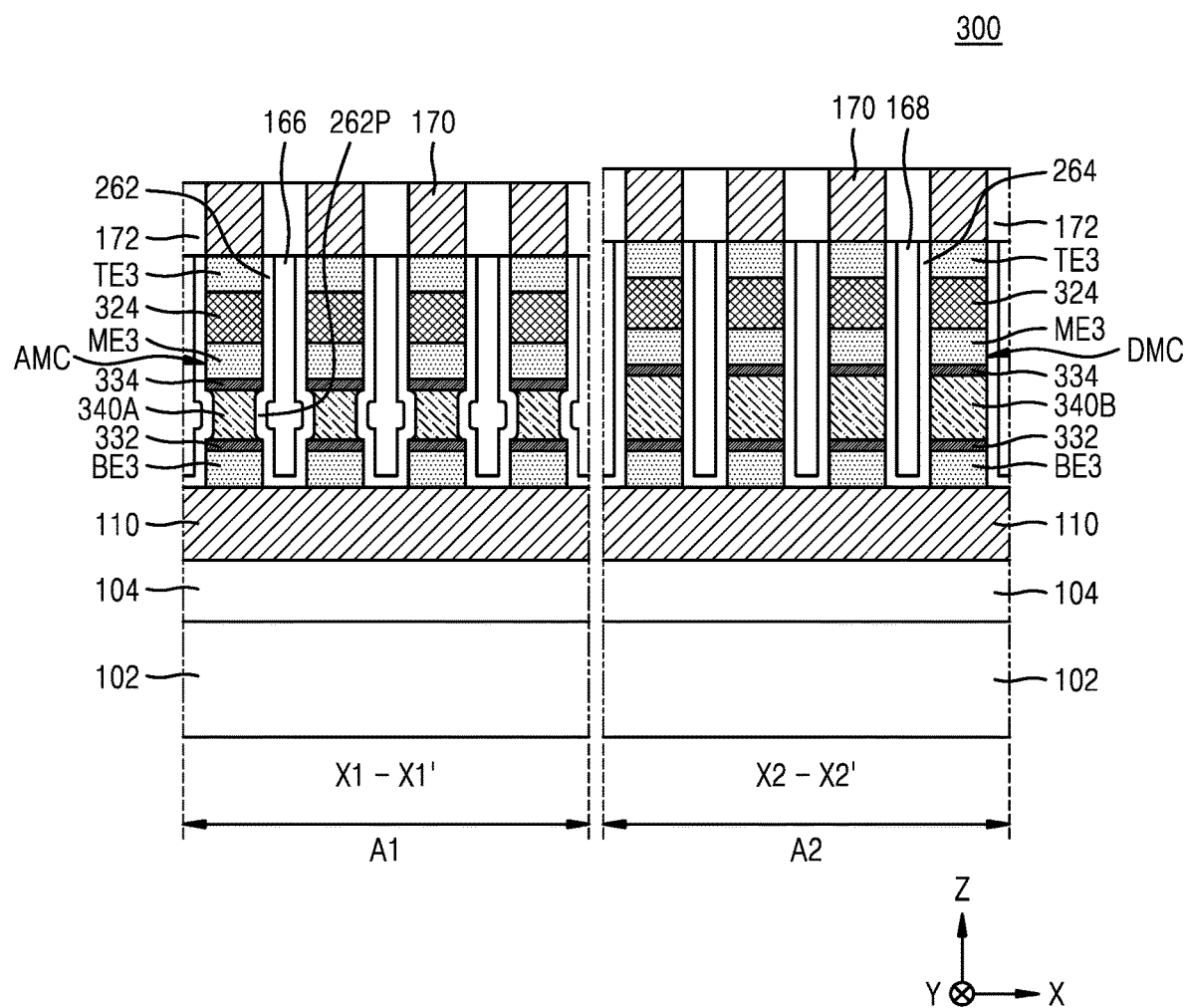
FIG. 7 is a cross-sectional view of a resistive memory device according to another embodiment of the inventive concept.

FIG. 7 is a cross-sectional view of a resistive memory device 300 according to another embodiment of the inventive concept. In FIG. 7, the same reference numerals as in FIGS. 4, 5A, 5B, and 6 may denote the same members, and a repeated description thereof is omitted. FIG. 7 illustrates some components of the portions corresponding to cross-sections taken along lines X1-X1' and X2-X2' in FIG. 4. The resistive memory device 300 illustrated in FIG. 7 may have substantially the same or similar plan layout as illustrated in FIG. 4.

Referring to FIG. 7, the resistive memory device 300 may have substantially the same configuration as the resistive memory device 200 described with reference to FIG. 6. However, in the first area A1, each of the plurality of active memory cells AMC may include a lower electrode BE3, a lower barrier 332, a first resistive memory pattern 340A, an upper barrier 334, a middle electrode ME3, a select element 324, and an upper electrode TE3, which are sequentially stacked on the first conductive line 110. In the horizontal direction (for example, X direction or Y direction), a width of the first resistive memory pattern 340A of the active memory cell AMC in the first area A1 may be less than a width of each of the lower barrier 332 and the upper barrier 334, which contact the bottom surface and the top surface of the first resistive memory pattern 340A, respectively. In the second area A2, each of the plurality of dummy memory cells DMC may include the lower electrode BE3, the lower barrier 332, a second resistive memory pattern 340B, the upper barrier 334, the middle electrode ME3, the select element 324, and the upper electrode TE3, which are sequentially stacked on the first conductive line 110. In the horizontal direction (for example, X direction or Y direction), a width of the second resistive memory pattern 340B of the dummy memory cell DMC in the second area A2 may be substantially the same as a width of each of the lower barrier 332 and the upper barrier 334, which contact the bottom surface and the top surface of the second resistive memory pattern 340B, respectively.

Detailed descriptions of the lower electrode BE3, the lower barrier 332, the first resistive memory pattern 340A, the second resistive memory pattern 340B, the upper barrier 334, the middle electrode ME2, the select element 324, and the upper electrode TE3 may be substantially the same as descriptions given with reference to FIGS. 4, 5A, and 5B of the lower electrode BE, the lower barrier 132, the first resistive memory pattern 140A, the second resistive memory pattern 140B, the upper barrier 134, the middle electrode ME, the select element 124, and the upper electrode TE.

In the resistive memory device 300, each of the plurality of first resistive memory patterns 340A and the plurality of second resistive memory patterns 340B may be connected to one first conductive line 110 of the plurality of first conductive lines 110, and each of the plurality of select elements 324 may be connected to one second conductive line 170 of the plurality of second conductive lines 170.

Figure 8A:
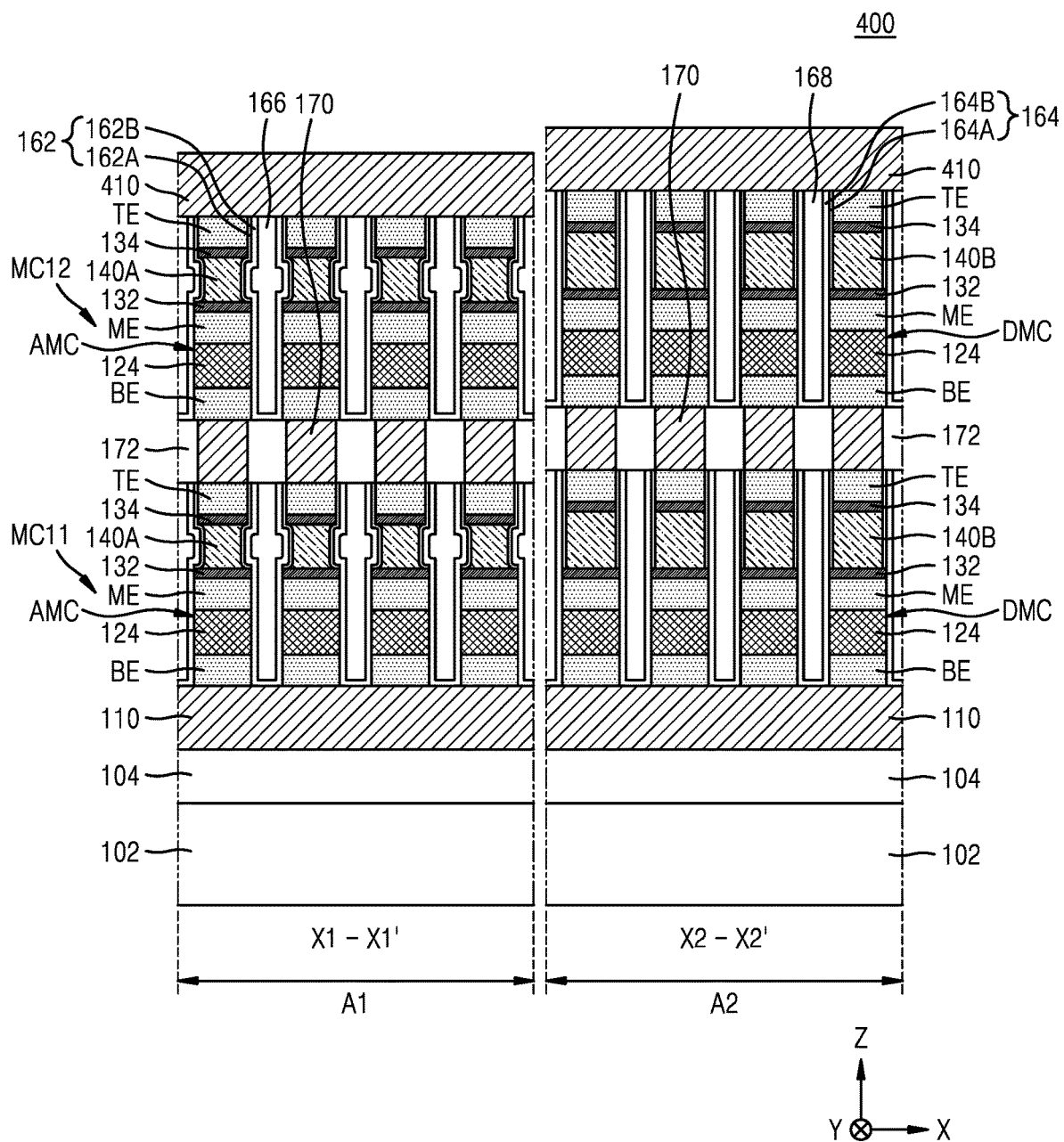
FIG. 8A is a cross-sectional view of a resistive memory device according to another example embodiment of the inventive concept.
Figure 8B:
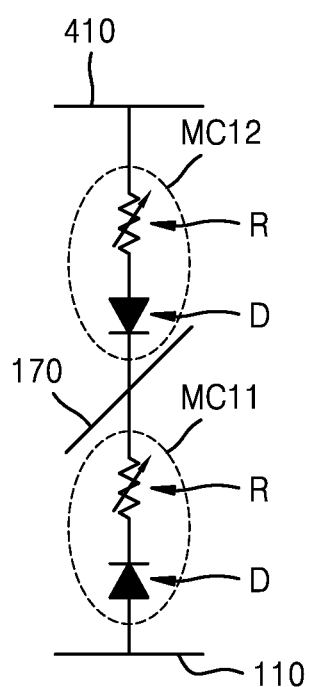
FIG. 8B is an equivalent circuit diagram of some memory cells constituting the resistive memory device illustrated in FIG. 8A.

FIG. 8A is a cross-sectional view of a resistive memory device 400 according to another example embodiment of the inventive concept, and FIG. 8B is an equivalent circuit diagram of some memory cells constituting the resistive memory device 400 illustrated in FIG. 8A. In FIGS. 8A and 8B, the same reference numerals as in FIGS. 4, 5A, and 5B may denote the same members, and a repeated description thereof is omitted. FIG. 8A illustrates some components of the portions corresponding to cross-sections taken along lines X1-X1' and X2-X2' in FIG. 4.

Referring to FIGS. 8A and 8B, the resistive memory device 400 may include the plurality of first conductive lines 110 extending parallel to each other in the first horizontal direction (X direction) on the substrate 102, the plurality of second conductive lines 170 extending parallel to each other in the second horizontal direction (Y direction) crossing the first horizontal direction (X direction), and a plurality of third conductive lines 410 extending parallel to each other in the first horizontal direction (X direction).

Each of a plurality of first level memory cells MC11 may be at a plurality of intersections between the plurality of first conductive lines 110 and the plurality of second conductive lines 170, and a plurality of second level memory cells MC12 may be at a plurality of intersections between the plurality of second conductive lines 170 and the plurality of third conductive lines 410. The plurality of first level memory cells MC11 and the plurality of second level memory cells MC12 may be formed at different levels in the vertical direction (Z direction).

The plurality of first level memory cells MC11 and the plurality of second level memory cells MC12 may include the plurality of active memory cells AMC and the plurality of dummy memory cells DMC as described with reference to FIGS. 4, 5A, and 5B, respectively. In the plurality of first level memory cells MC11 and the plurality of second level memory cells MC12, a space between each of the plurality of active memory cells AMC in the first area A1 may be filled with the plurality of encapsulation insulating layers 162 and the first gap fill insulating layer 166. A space between each of the plurality of dummy memory cells DMC in the second area A2 may be filled with the plurality of second encapsulation insulating layers 164 and the second gap fill insulating layer 168.

Each of the plurality of first conductive lines 110, the plurality of second conductive lines 170, and the plurality of third conductive lines 410 may constitute the plurality of word lines or the plurality of bit lines. In an example, each of the plurality of first conductive lines 110 and the plurality of third conductive lines 410 may constitute the plurality of bit lines BL, and each of the plurality of second conductive lines 170 may constitute a common word line. In another example, each of the plurality of first conductive lines 110 and the plurality of third conductive lines 410 may constitute the plurality of word lines WL, and each of the plurality of second conductive lines 170 may constitute a common bit line BL.

A constituent material of the plurality of third conductive lines 410 may be substantially the same as that described for the plurality of first conductive lines 110 and the plurality of second conductive lines 170 with reference to FIGS. 4, 5A, and 5B.

The resistive memory device 400 may have a two-layer stack structure including the plurality of active memory cells AMC and the plurality of dummy memory cells DMC formed at two different levels in the vertical direction (Z direction).

Figure 9:
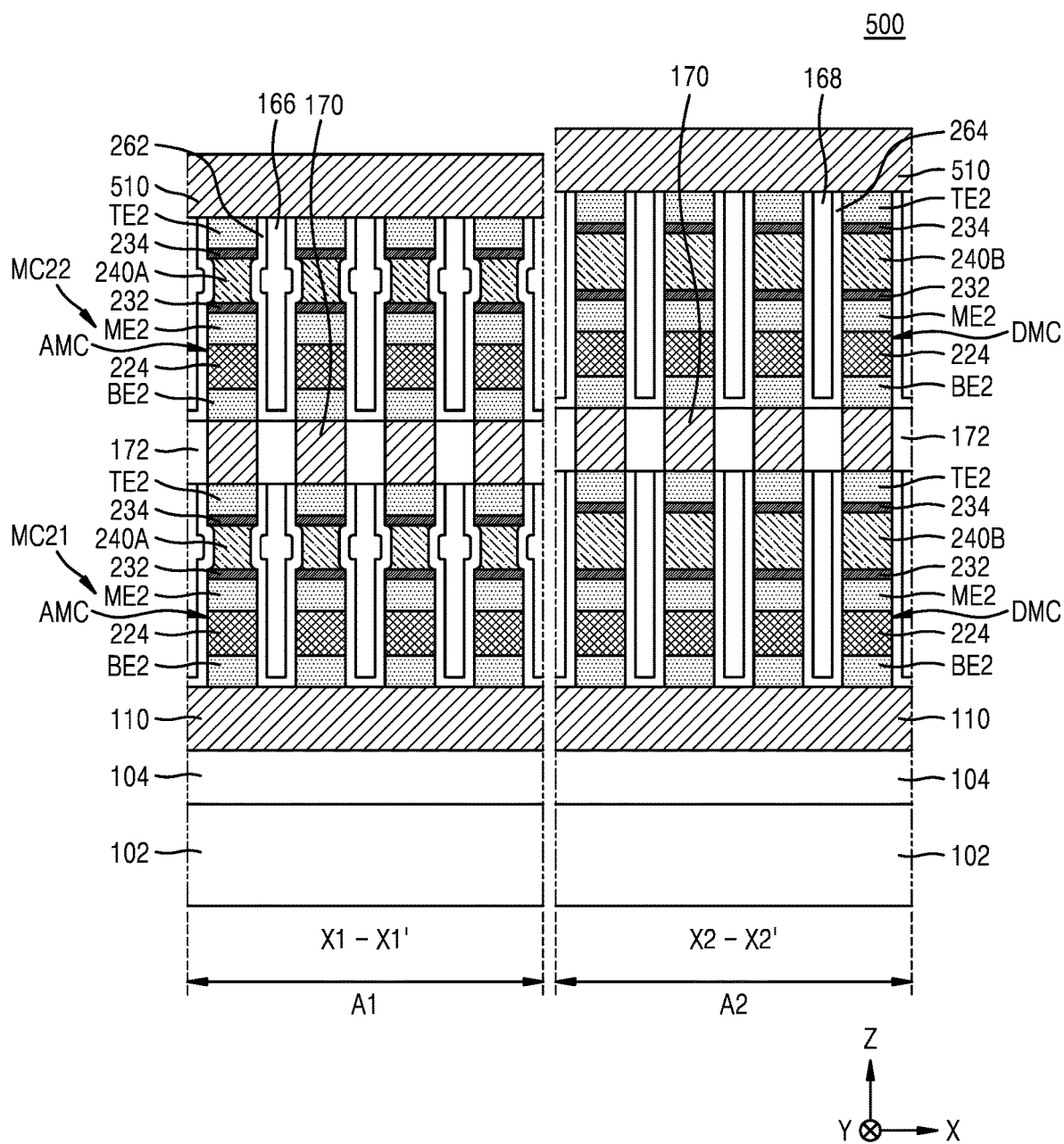
FIG. 9 is a cross-sectional view of a resistive memory device according to another embodiment of the inventive concept.

FIG. 9 is a cross-sectional view of a resistive memory device 500 according to another embodiment of the inventive concept. In FIG. 9, the same reference numerals as in FIGS. 4 through 6 may denote the same members, and a repeated description thereof is omitted. FIG. 9 illustrates some components of the portions corresponding to cross-sections taken along lines X1-X1' and X2-X2' in FIG. 4. Some of the memory cells constituting the resistive memory device 500 illustrated in FIG. 9 may have an equivalent circuit configuration similar to the equivalent circuit illustrated in FIG. 8B.

Referring to FIG. 9, the resistive memory device 500 may include the plurality of first conductive lines 110 extending parallel to each other in the first horizontal direction (X direction) on the substrate 102, the plurality of second conductive lines 170 extending parallel to each other in the second horizontal direction (Y direction) crossing the first horizontal direction (X direction), and a plurality of third conductive lines 510 extending parallel to each other in the first horizontal direction (X direction).

Each of a plurality of first level memory cells MC21 may be at a plurality of intersections between the plurality of first conductive lines 110 and the plurality of second conductive lines 170, and a plurality of second level memory cells MC22 may be at a plurality of intersections between the plurality of second conductive lines 170 and the plurality of third conductive lines 510. The plurality of first level memory cells MC21 and the plurality of second level memory cells MC22 may be formed at different levels in the vertical direction (Z direction).

The plurality of first level memory cells MC21 and the plurality of second level memory cells MC22 may include the plurality of active memory cells AMC and the plurality of dummy memory cells DMC as described with reference to FIG. 6. In the plurality of first level memory cells MC21 and the plurality of second level memory cells MC22, a space between each of the plurality of active memory cells AMC in the first area A1 may be filled with the plurality of encapsulation insulating layers 262 and the first gap fill insulating layer 166. A space between each of the plurality of dummy memory cells DMC in the second area A2 may be filled with a plurality of second encapsulation insulating layers 264 and the second gap fill insulating layer 168.

Each of the plurality of first conductive lines 110, the plurality of second conductive lines 170, and a plurality of third conductive lines 510 may constitute the plurality of word lines WL or the plurality of bit lines BL. In an example, each of the plurality of first conductive lines 110 and the plurality of third conductive lines 510 may constitute the plurality of bit lines BL, and each of the plurality of second conductive lines 170 may constitute a common word line WL. In another example, each of the plurality of first conductive lines 110 and the plurality of third conductive lines 510 may constitute the plurality of word lines WL, and each of the plurality of second conductive lines 170 may constitute a common bit line BL.

A constituent material of the plurality of third conductive lines 510 may be substantially the same as that described for the plurality of first conductive lines 110 and the plurality of second conductive lines 170 with reference to FIGS. 4, 5A, and 5B.

The resistive memory device 500 may have a two-layer stack structure including the plurality of active memory cells AMC and the plurality of dummy memory cells DMC formed at two different levels in the vertical direction (Z direction).

In FIGS. 8A, 8B, and 9, the resistive memory devices 400 and 500 having the two-layer stack structure formed at two different levels in the vertical direction (Z direction) are illustrated, but the embodiments are not limited thereto. For example, a resistive memory device according to embodiments of the inventive concept may have a 4-layer or 6-layer stack structure.

Figure 10:
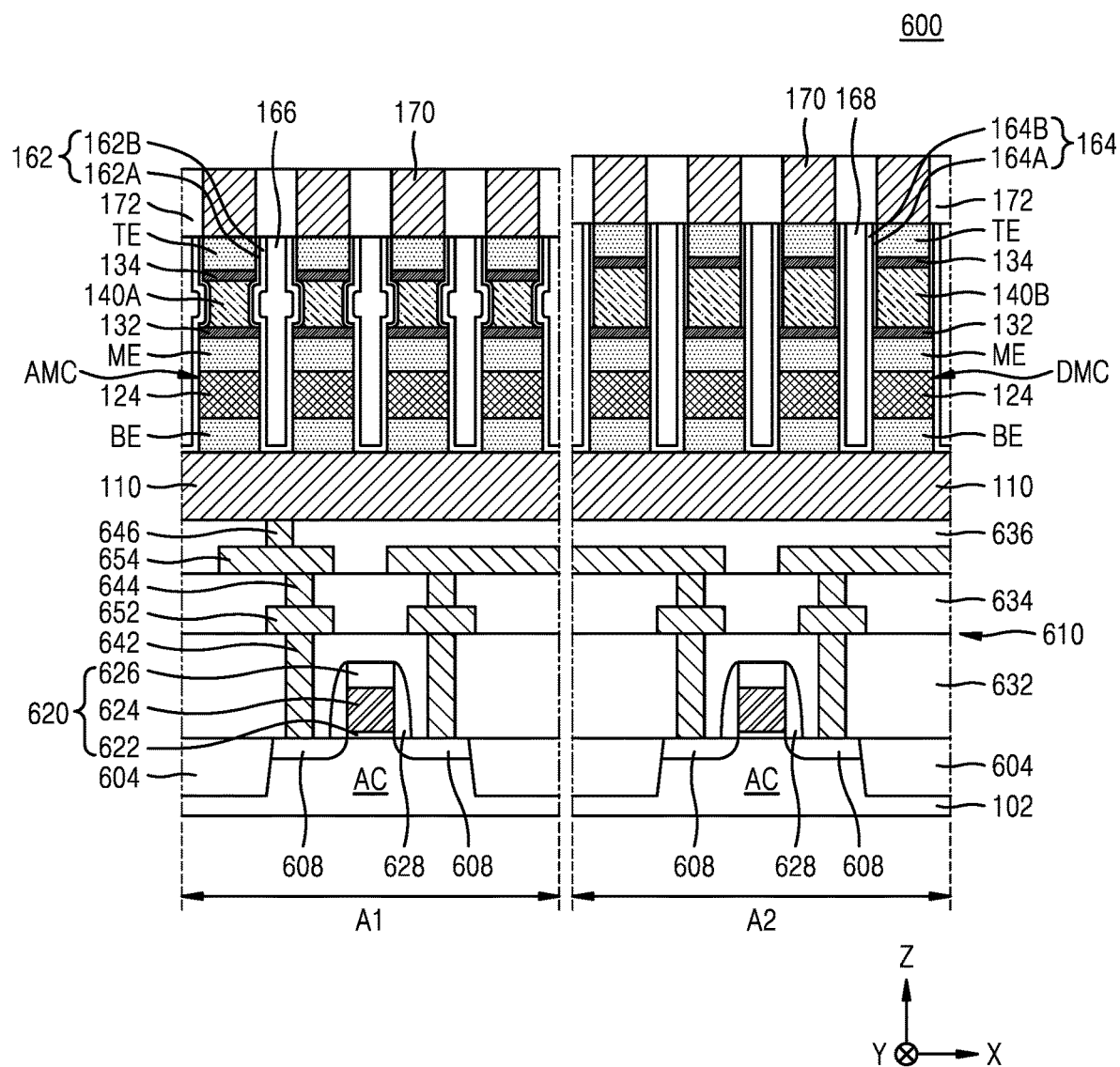
FIG. 10 is a cross-sectional view of a resistive memory device according to another embodiment of the inventive concept.

FIG. 10 is a cross-sectional view of a resistive memory device 600 according to another embodiment of the inventive concept. In FIG. 10, the same reference numerals as in FIGS. 4, 5A, and 5B may denote the same members, and a repeated description thereof is omitted.

Referring to FIG. 10, the resistive memory device 600 may have substantially the same configuration as that of the resistive memory device 100 illustrated in FIGS. 4, 5A, and 5B. However, the resistive memory device 600 may further include a lower structure 610 that is between the substrate 102 and the plurality of first conductive lines 110 and includes a plurality of transistors and a plurality of wirings.

An element isolation region 604 defining a plurality of active areas AC may be formed on the substrate 102. The lower structure 610 may include a gate structure 620, a plurality of interlayer insulating layers 632, 634, and 636, a plurality of contact plugs 642, 644, and 646, and a plurality of wirings 652 and 654, which are formed on the active area AC of the substrate 102. The gate structure 620 may include a gate insulating layer 622, a gate 624, and an insulating capping layer 626 sequentially formed on the active area AC of the substrate 102. Both sidewalls of the gate structure 620 may be covered with insulating spacers 628. The gate insulating layer 622 may include silicon oxide or metal oxide. The gate 624 may include impurity-doped polysilicon, metal, metal nitride, or a combination thereof. The insulating capping layer 626 may include a nitride layer. The insulating spacer 628 may include an oxide layer, a nitride layer, or a combination thereof.

A pair of impurity regions 608 may be on both sides of the gate structure 620 on the active area AC of the substrate 102. The pair of impurity regions 608 may include N-type or P-type impurities. According to an impurity type included in the pair of impurity regions 608, the gate structure 620 and the pair of impurity regions 608 on both sides of the gate structure 620 may constitute an NMOS transistor or a PMOS transistor.

The interlayer insulating layer 632 may cover the gate structure 620, and the wiring 652 may be electrically connected to the impurity region 608 via a contact plug 642 penetrating the interlayer insulating layer 632. In addition, the interlayer insulating layer 634 may cover the wiring 652, and the wiring 654 may be electrically connected to the wiring 652 via a contact plug 644 penetrating the interlayer insulating layer 634.

The interlayer insulating layer 636 may cover the wiring 654, and the same structure as that described with reference to FIGS. 4, 5A, and 5B for the resistive memory device 100 may be on the interlayer insulating layer 636. The contact plug 646 may penetrate the interlayer insulating layer 636, and the first conductive line 110 may be electrically connected to the wiring 654 via the contact plug 646.

The plurality of interlayer insulating layers 632, 634, and 636 may include an oxide layer. Each of the plurality of contact plugs 642, 644, and 646 and the plurality of wirings 652 and 654 may include a metal, a conductive metal nitride, or a combination thereof. For example, the metal may include one of W, Al, Cu, and Ti.

In FIG. 10, the configuration of the lower structure 610 may be merely an example, and various modifications and changes may be possible within the scope of the technical idea of the inventive concept. For example, the lower structure 610 may include a single layer wiring structure or a multi-layer wiring structure of three or more layers.

In FIG. 10, a case is illustrated in which the same structure as described with reference to FIGS. 4, 5A, and 5B for the resistive memory device 100 is on the lower structure 610, but the technical idea of the inventive concept is not limited thereto. For example, on the lower structure 610 illustrated in FIG. 10, the same structures as described with reference to FIGS. 6, 7, 8A, and 9 for the resistive memory devices 200, 300, 400, and 500, and one structure selected from various structures modified and changed within the scope of the technical idea of the inventive concept may be arranged.

Figure 18:
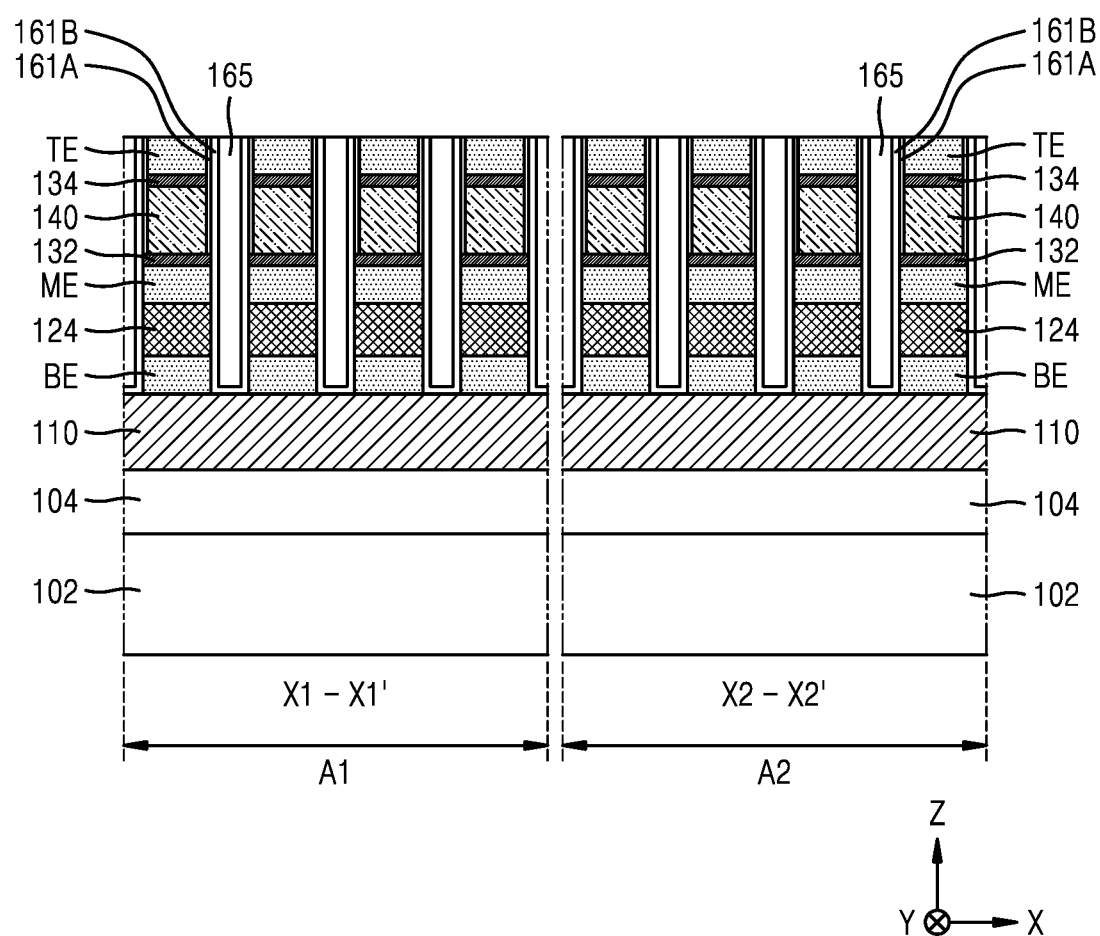
Figure 19A:
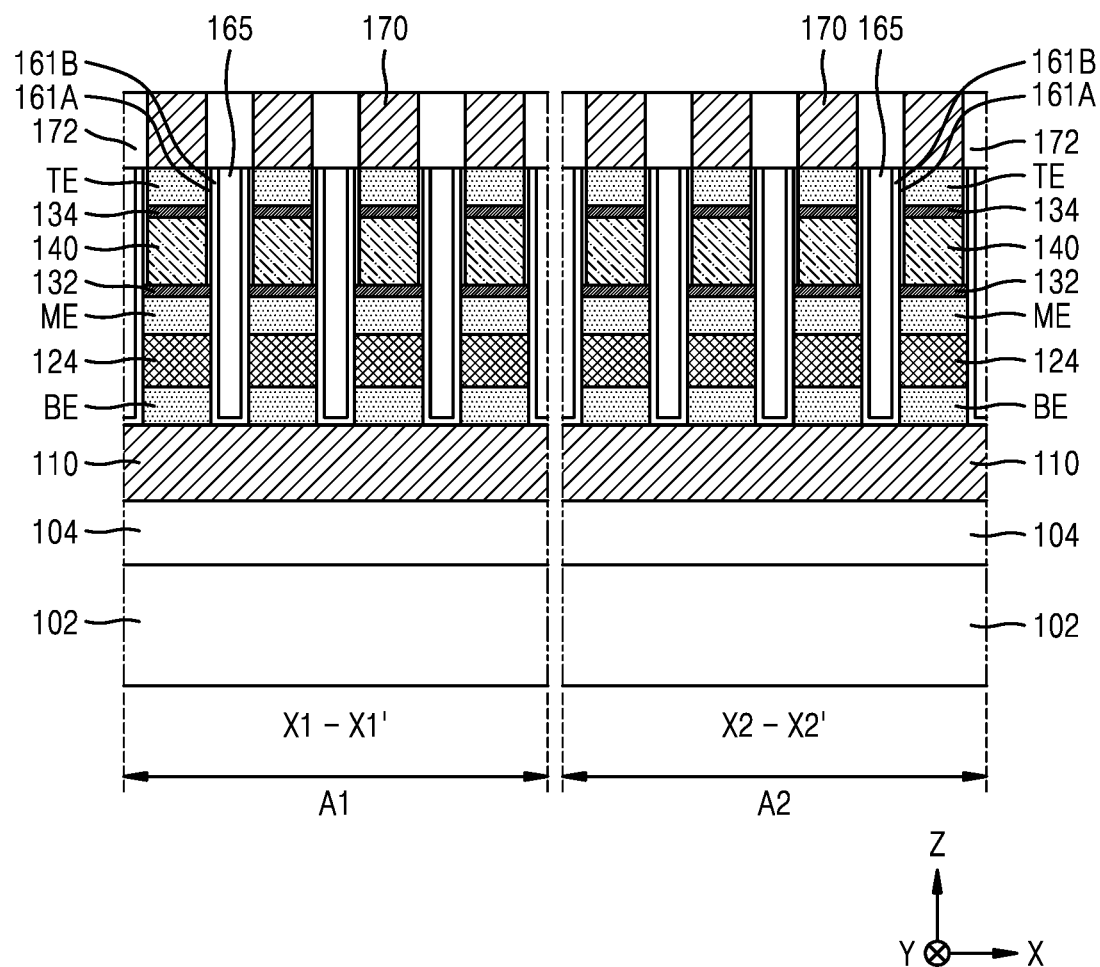
Figure 19B:
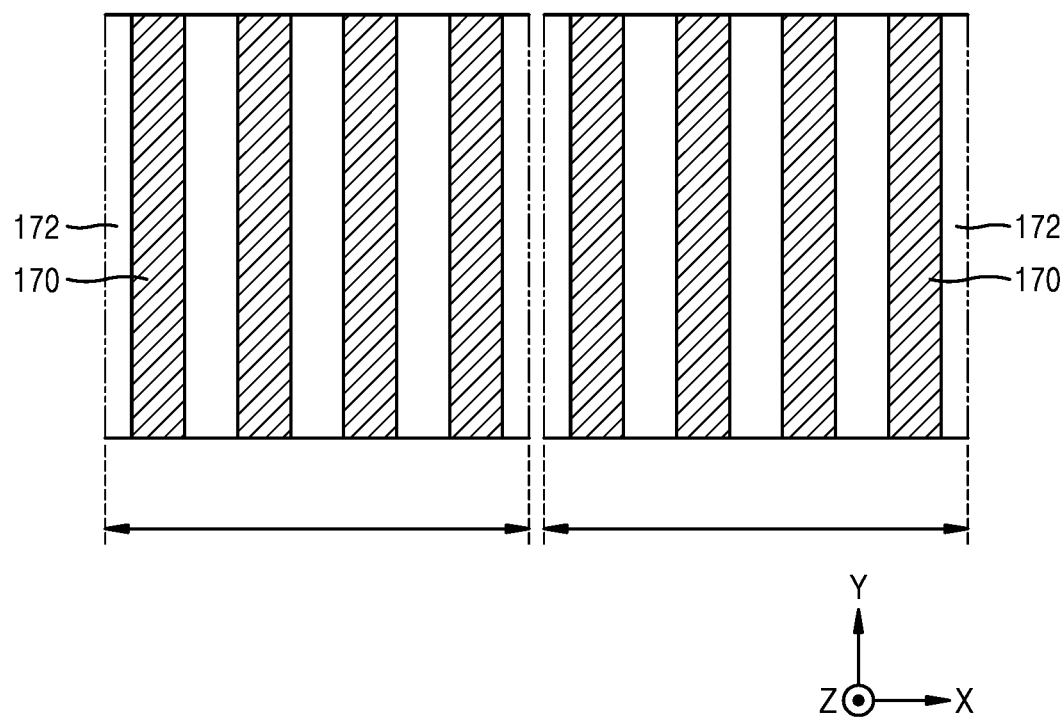
Figure 20A:
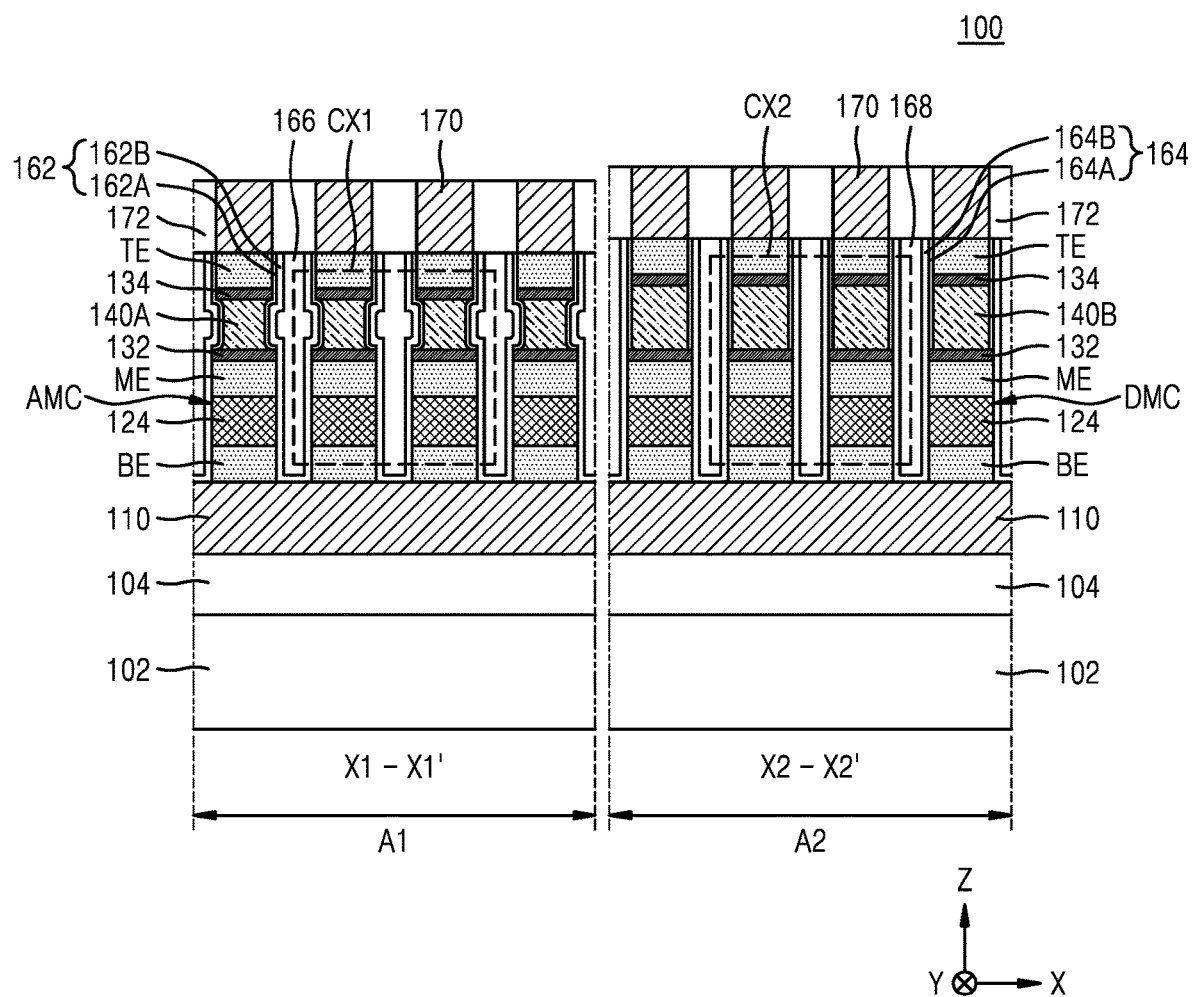
Figure 20B:
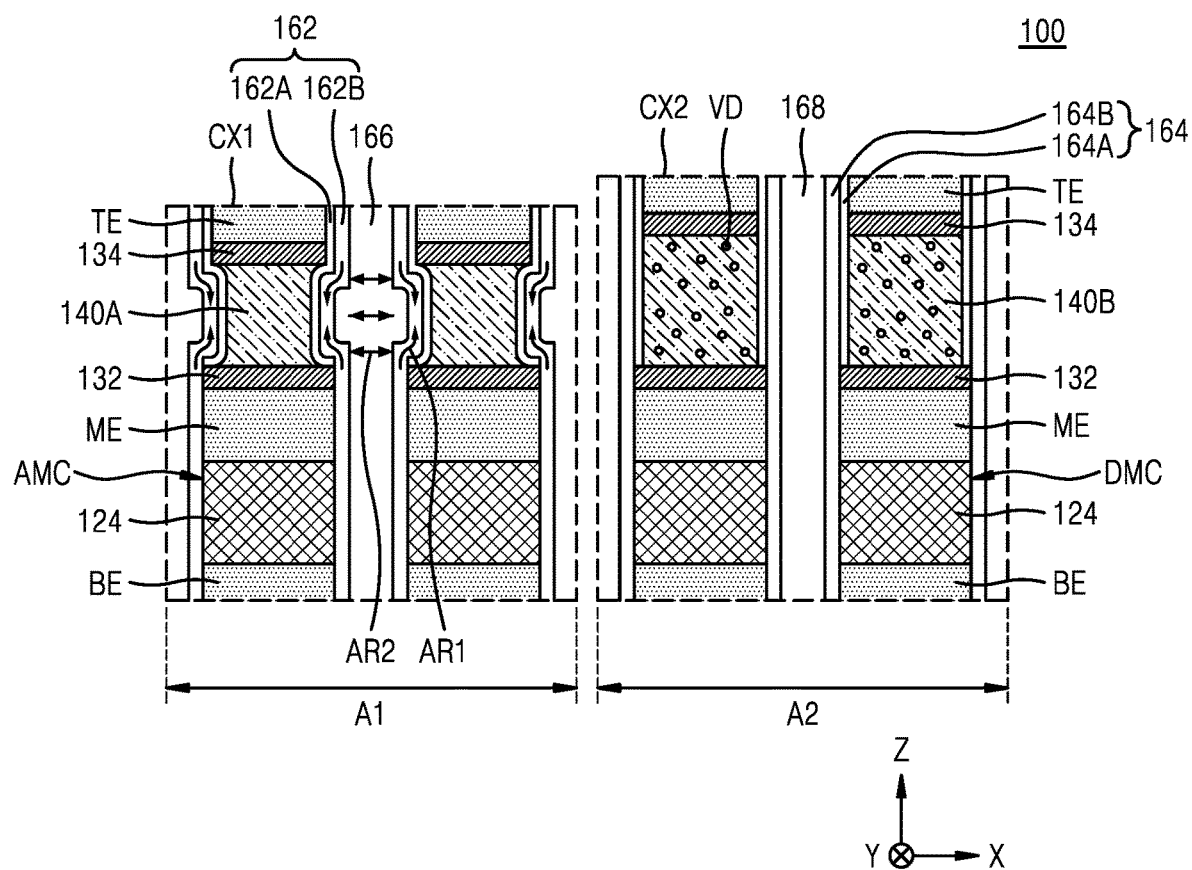

FIGS. 11A through 20B are cross-sectional views illustrating an example manufacturing method of a resistive memory device according to process sequences, according to embodiments of the inventive concept. In particular, FIGS. 11A, 12A, 13, 14, 15A, 16, 17, 18, 19A, and 20A are cross-sectional views illustrating an example manufacturing method of a resistive memory device according to a process sequence, according to embodiments of the inventive concept, FIGS. 11B, 12B, 15B, and FIG. 19B are plan views of regions illustrated in FIGS. 11A, 12A, 15A, and 19A, respectively, and FIG. 20B is an enlarged cross-sectional view of regions indicated by CX1 and CX2 in FIG. 20A. An example manufacturing method of the resistive memory device 100 illustrated in FIGS. 4, 5A, and 5B is described with reference to FIGS. 11A through 20B. In FIGS. 11A, 12A, 13, 14, 15A, 16, 17, 18, 19A, and 20A, main components of portions corresponding to cross-sections taken along lines X1-X1' and X2-X2' in FIG. 4 are illustrated according to the process sequence.

Figure 11A:
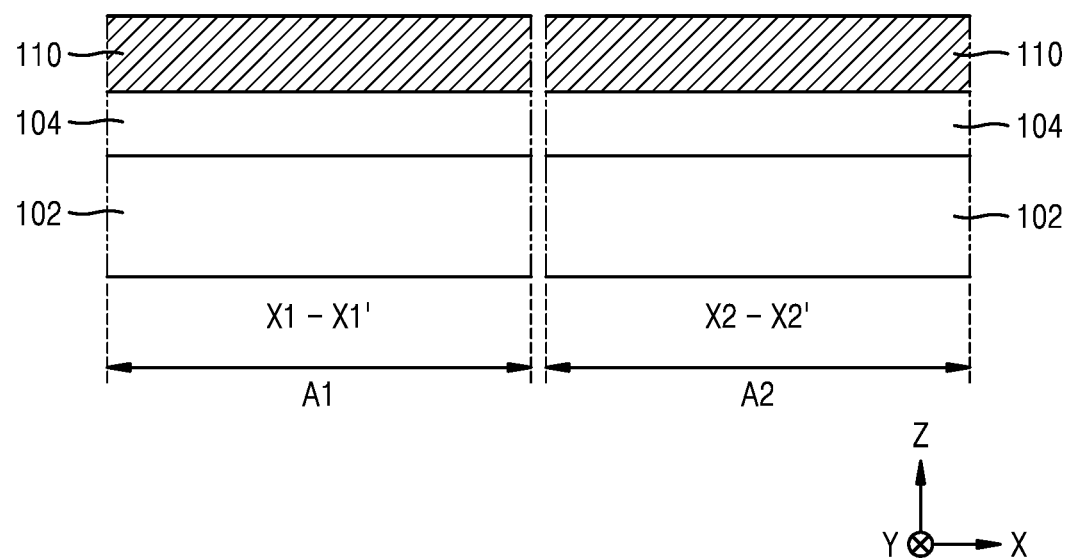
Figure 11B:
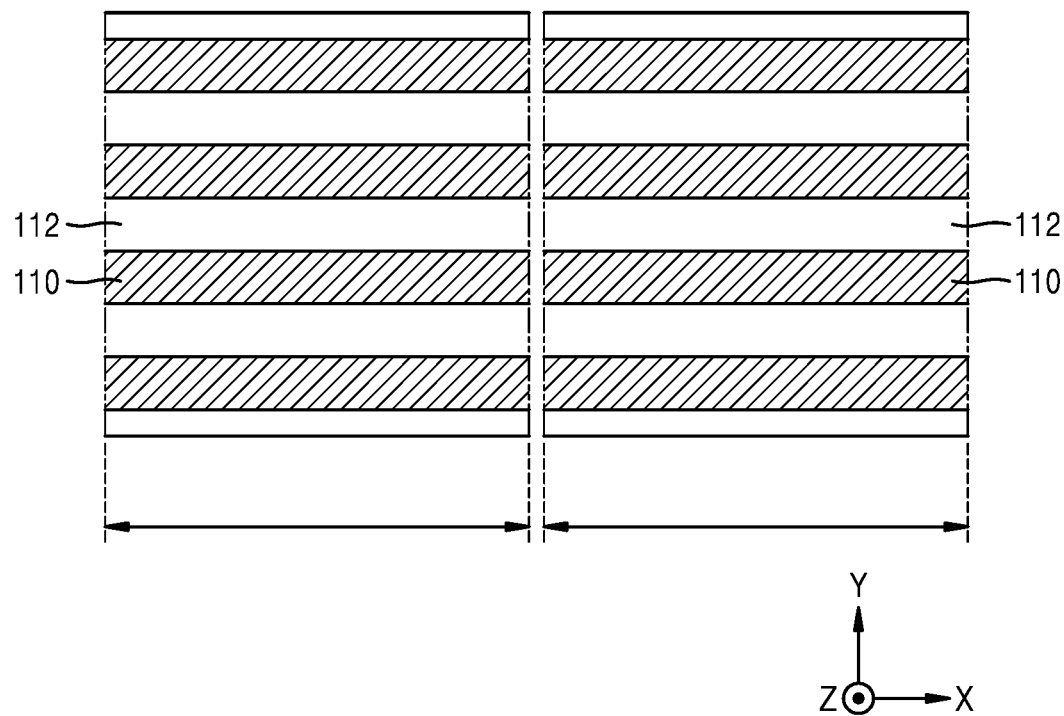
FIGS. 11B, 12B, 15B, and FIG. 19B are plan views of regions illustrated in FIGS. 11A, 12A, 15A, and 19A, respectively.

Referring to FIGS. 11A and 11B, the interlayer insulating layer 104 may be formed on the substrate 102 including the first area A1 and the second area A2, and the plurality of first conductive lines 110 and the plurality of first insulating patterns 112 separating each of the plurality of first conductive lines 110 may be formed on the interlayer insulating layer 104.

Figure 12A:
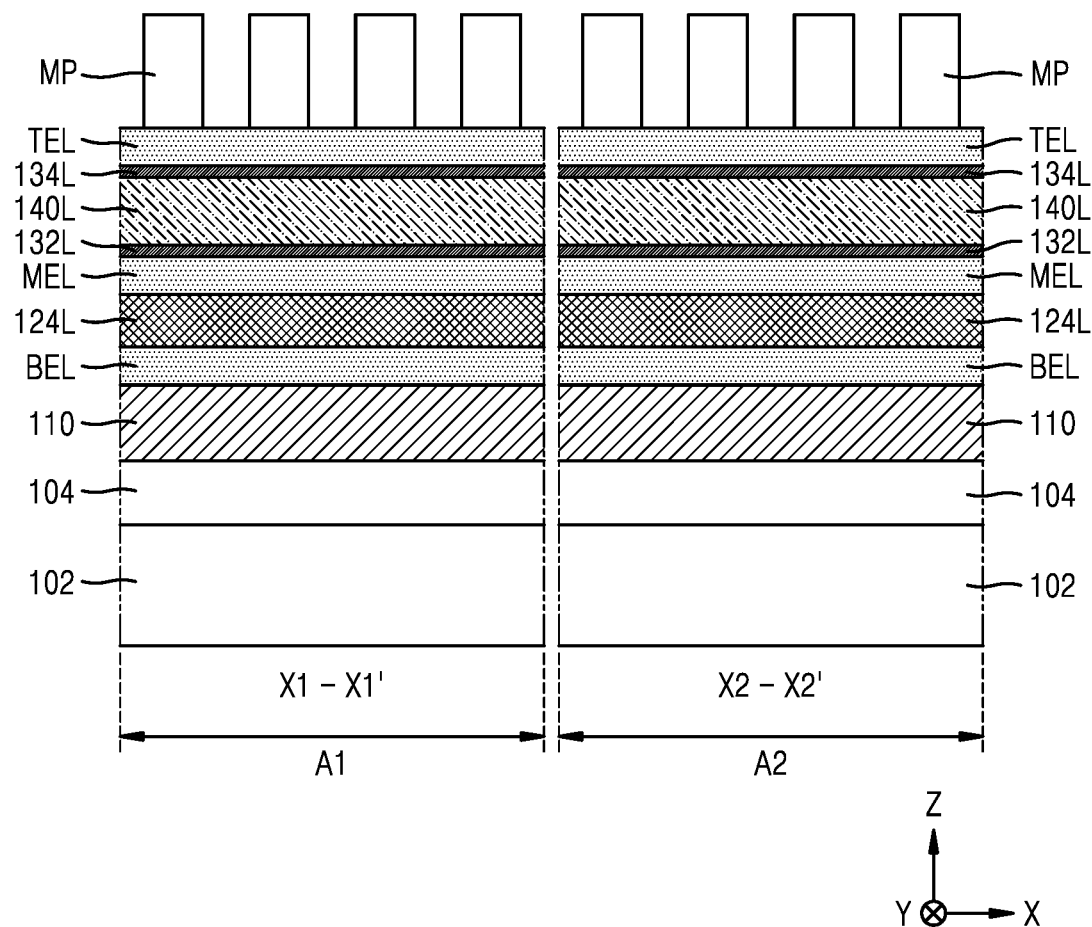
Figure 12B:
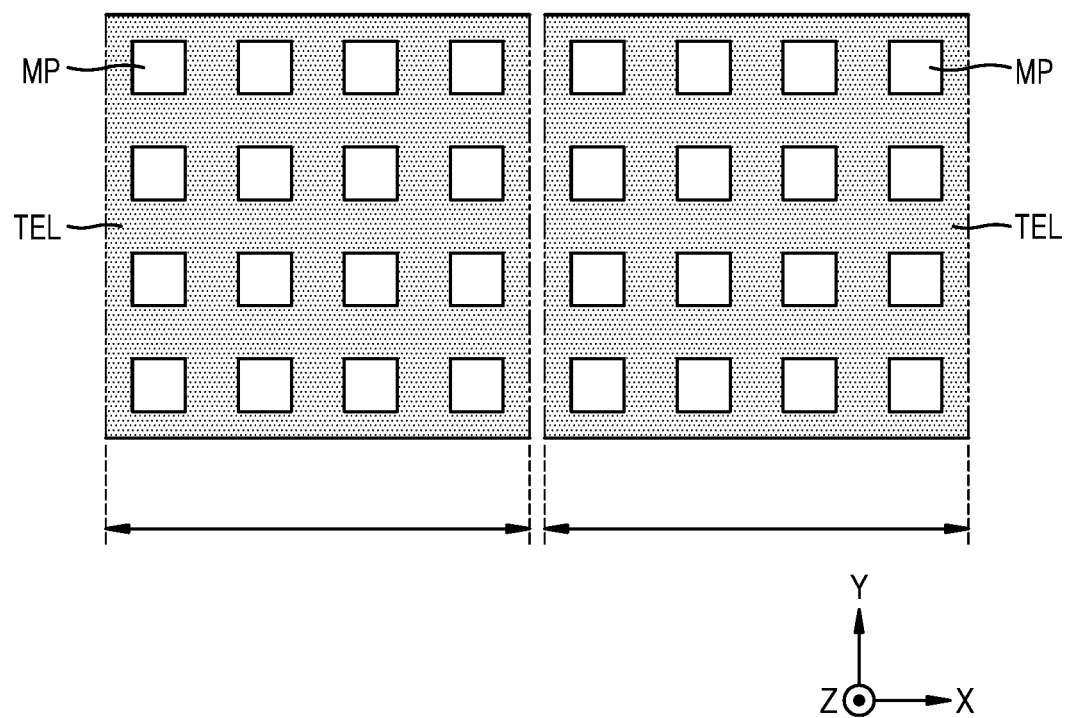

Referring to FIGS. 12A and 12B, in the first area A1 and the second area A2, a lower electrode layer BEL, a select element layer 124L, a middle electrode layer MEL, a lower barrier layer 132L, a resistive memory layer 140L, an upper barrier layer 134L, and an upper electrode layer TEL may be sequentially formed on the plurality of first conductive lines 110 and the plurality of first insulating patterns 112, and then a mask pattern MP may be formed on the upper electrode layer TEL.

A constituent material of each of the lower electrode layer BEL, the select element layer 124L, the middle electrode layer MEL, the lower barrier layer 132L, the resistive memory layer 140L, the upper barrier layer 134L, and the upper electrode layer TEL may be the same as that described with reference to FIGS. 4, 5A, and 5B for the constituent material of each of the lower electrode BE, the select element layer 124, the middle electrode ME, the lower barrier 132, the second resistive memory pattern 140B, and the upper barrier 134, and the upper electrode TE, respectively.

The mask pattern MP may have a plan shape of a plurality of island patterns. Portions of the upper electrode layer TEL covered by the mask pattern MP may correspond to positions of the plurality of memory cells MC to be formed on the substrate 102. In example embodiments, the mask pattern MP may include a hard mask including an oxide layer, a nitride layer, or a combination thereof. In example embodiments, to form the mask pattern MP, a process of photolithography using extreme ultraviolet (EUV) light (about 13.5 nm), KrF excimer laser (about 248 nm), ArF excimer laser, or F2 excimer laser (about 157 nm) as a light source may be used.

Figure 13:
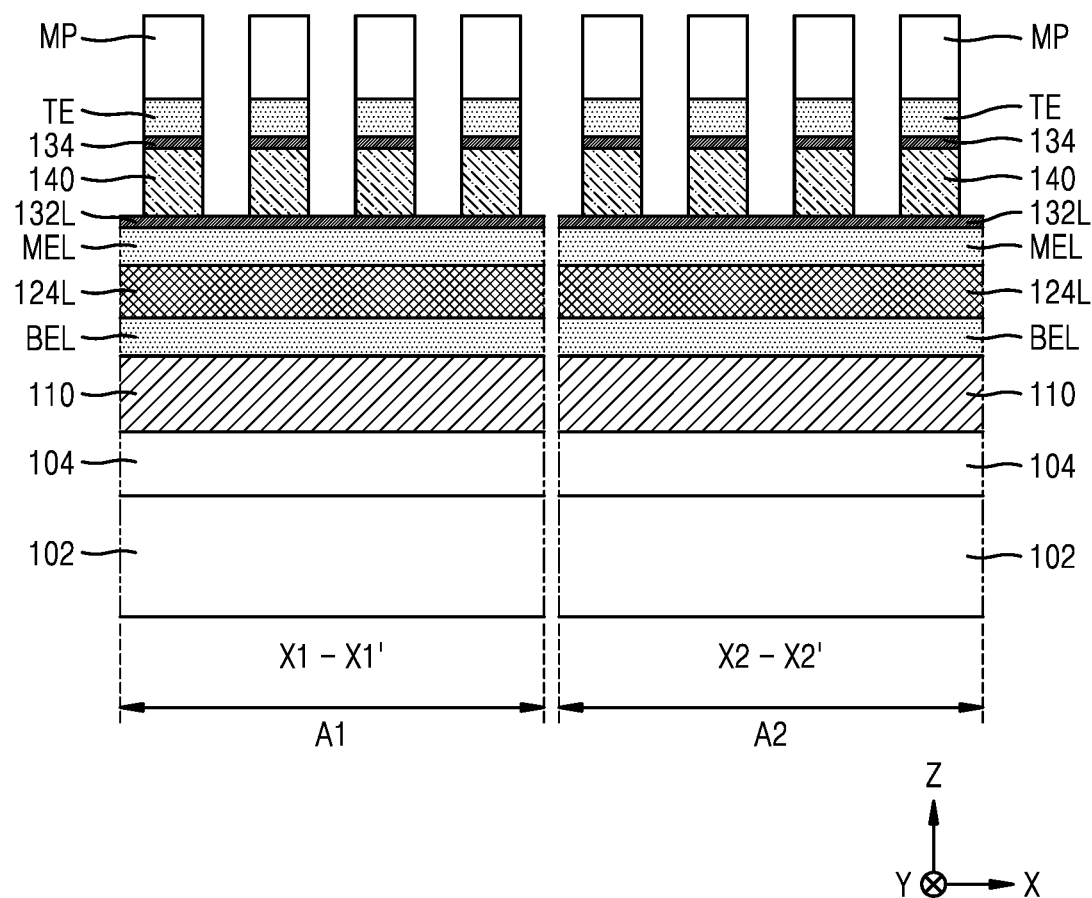

Referring to FIG. 13, the plurality of upper electrodes TE, the plurality of upper barriers 134, and the plurality of resistive memory patterns 140 may be formed by anisotropically etching the upper electrode layer TEL, the upper barrier layer 134L, and the resistive memory layer 140L from results of FIGS. 12A and 12B by using the mask pattern MP as an etching mask. While the upper electrode layer TEL, the upper barrier layer 134L, and the resistive memory layer 140L are anisotropically etched, a portion of the mask pattern MP may be consumed, and accordingly, a thickness of the mask pattern MP may be decreased.

Figure 14:
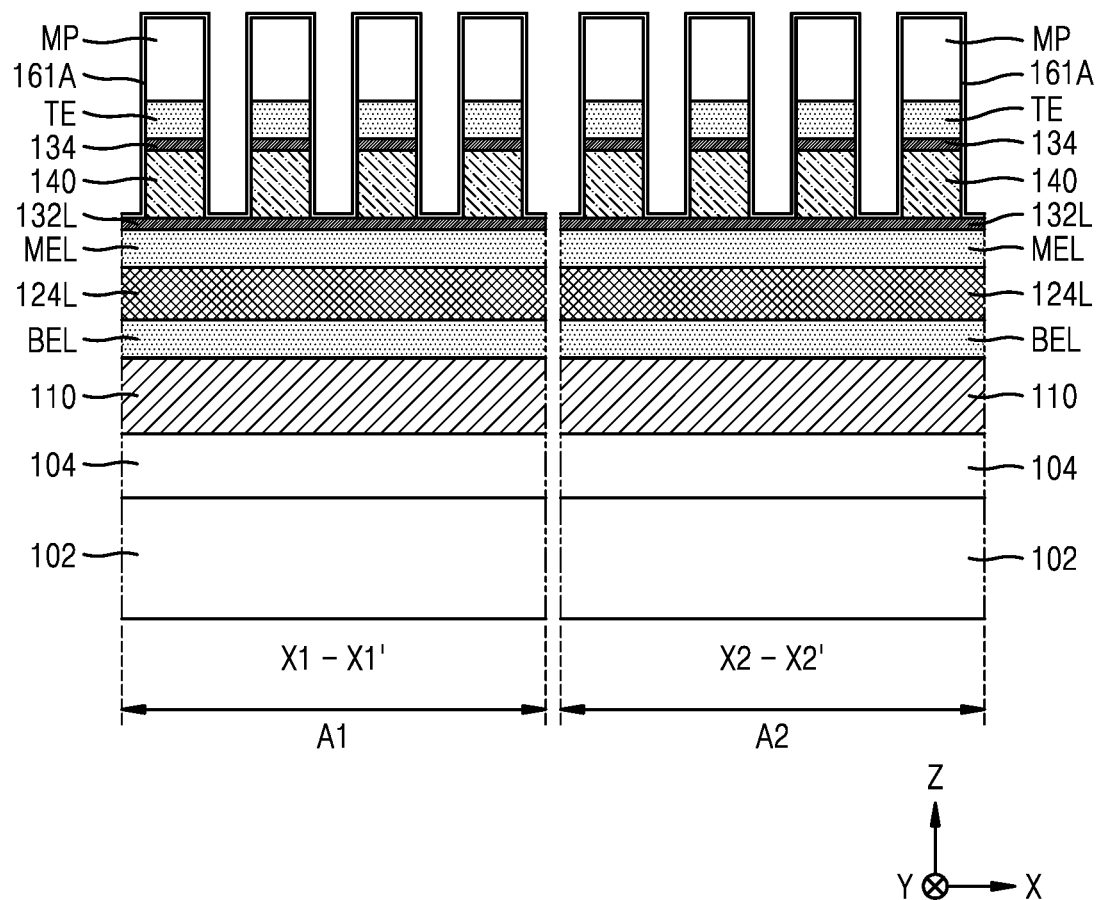

Referring to FIG. 14, an internal liner layer 161A may be formed to conformally cover surfaces exposed in the result of FIG. 13. The internal liner layer 161A may contact sidewalls of each of the plurality of resistive memory patterns 140, the plurality of upper barriers 134, and the plurality of upper electrodes TE.

In example embodiments, the internal liner layer 161A may include or may be formed of a silicon oxide. In example embodiments, an atomic layer deposition (ALD) process or a chemical vapor deposition (CVD) process may be performed at a relatively low temperature of about 100° C. or less, for example, about 60° C. to about 100° C. to form the internal liner layer 161A. While the internal liner layer 161A is formed, reducing processing temperature for forming the internal liner layer 161A may be advantageous to prevent the plurality of resistive memory patterns 140 from being deteriorated.

Figure 15A:
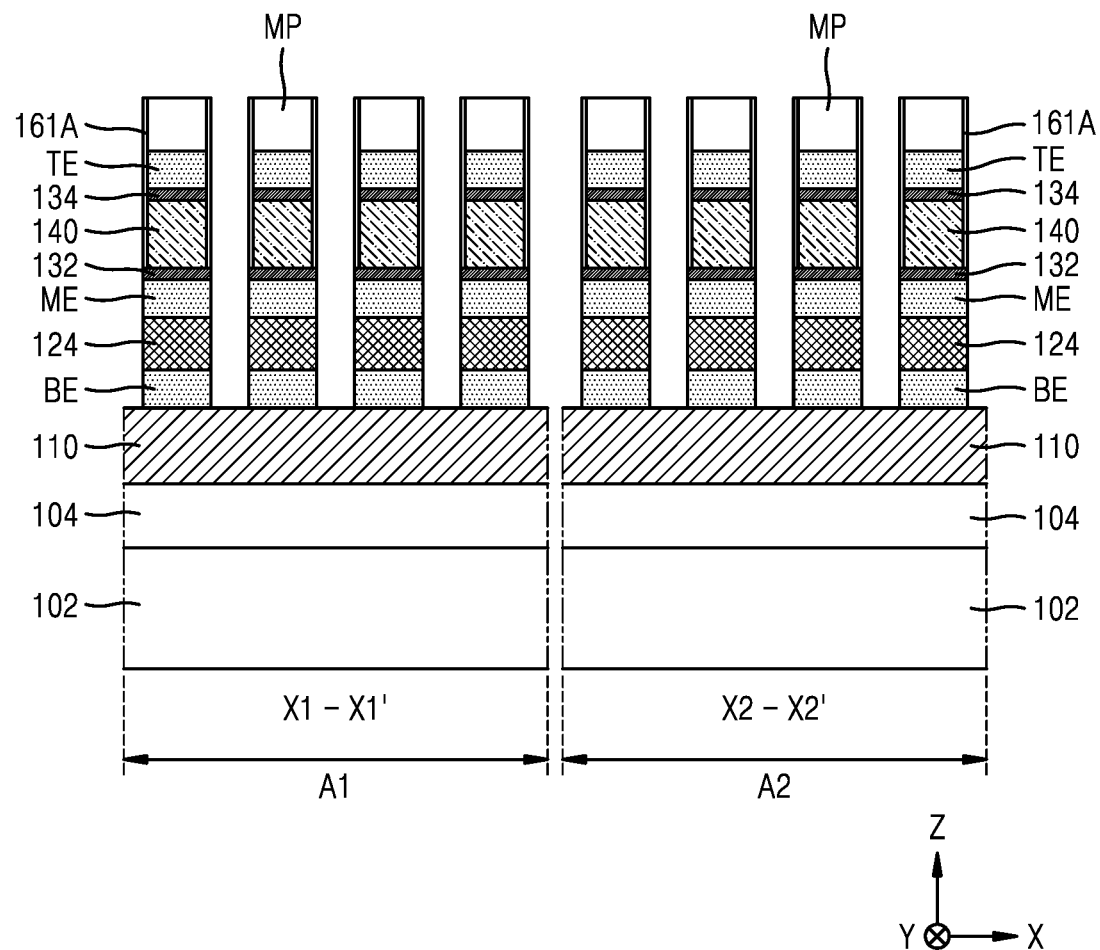
Figure 15B:
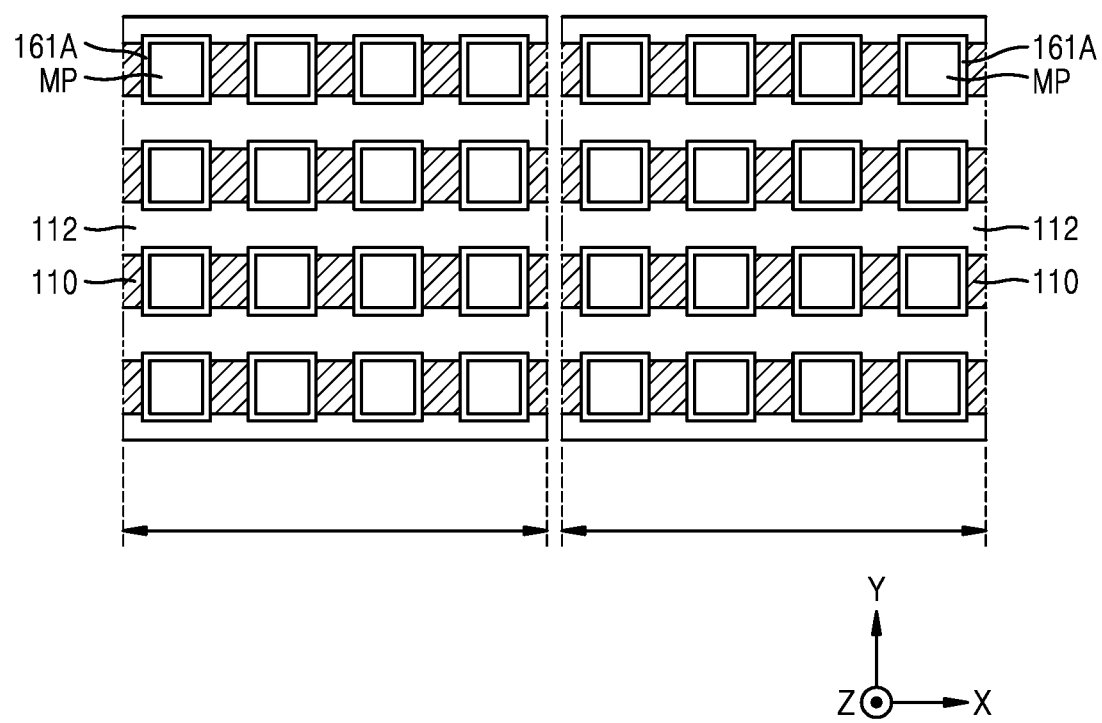

Referring to FIGS. 15A and 15B, by anisotropically etching the result of FIG. 14 by using the mask pattern MP and the internal liner layer 161A as etching masks, the lower barrier layer 132L, the middle electrode layer MEL, the select element layer 124L, and the lower electrode layer BEL, the plurality of lower barrier layers 132, the plurality of middle electrodes ME, the plurality of select elements 124, and the plurality of lower electrodes BE may be formed.

While the lower barrier layer 132L, the middle electrode layer MEL, the select element layer 124L, and the lower electrode layer BEL are anisotropically etched, the internal liner layer 161A may protect the plurality of resistive memory patterns 140 from the etching environment. While the lower barrier layer 132L, the middle electrode layer MEL, the select element layer 124L, and the lower electrode layer BEL are anisotropically etched, some portions of the mask pattern MP and the internal liner layer 161A may be consumed, and accordingly, thicknesses thereof may be reduced.

Figure 16:
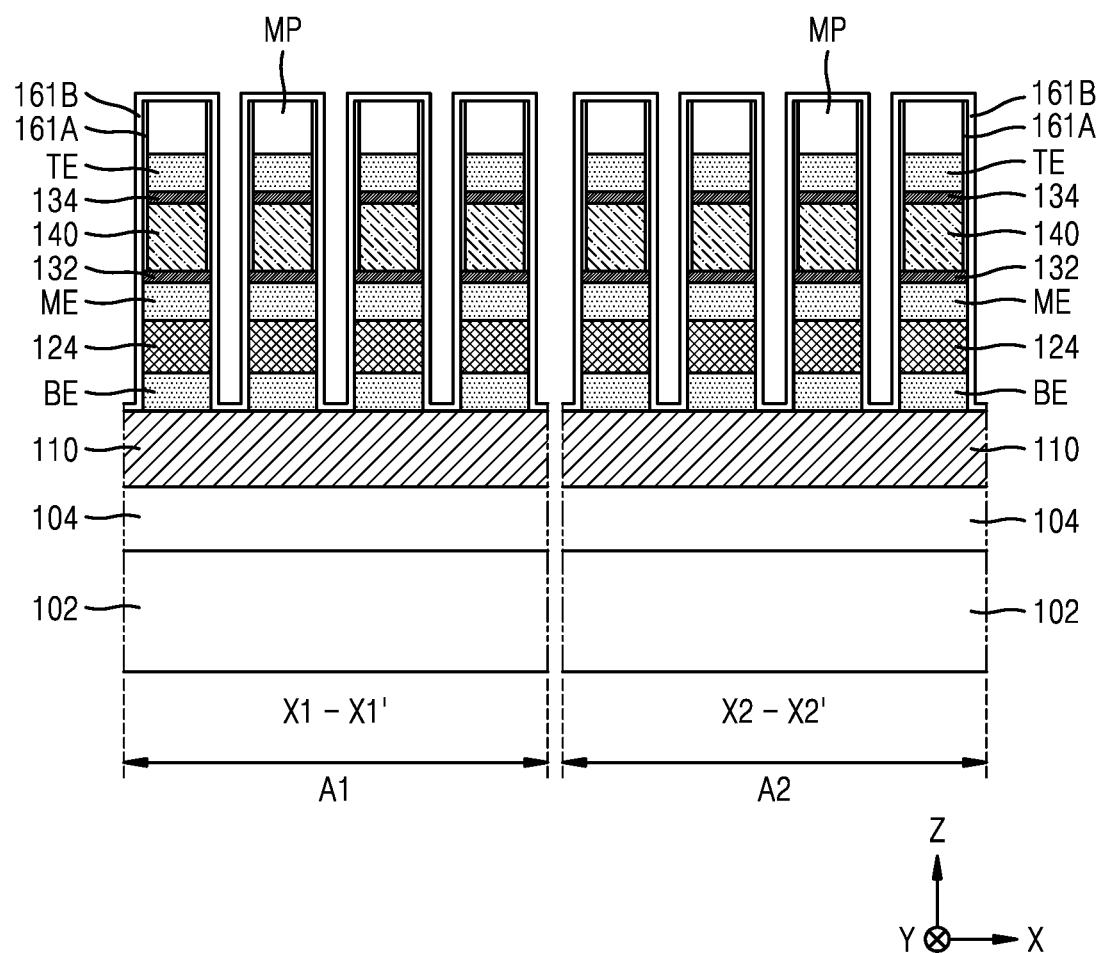

Referring to FIG. 16, an external liner layer 161B conformally covering surfaces exposed in the result of FIGS. 15A and 15B may be formed. The external liner layer 161B may, with the inner liner layer 161A therebetween, cover sidewalls of each of the plurality of resistive memory patterns 140, the plurality of upper barriers 134, and the plurality of upper electrodes TE. In addition, the external liner layer 161B may contact sidewalls of each of the plurality of lower electrodes BE, the plurality of select elements 124, the plurality of middle electrodes ME, and the plurality of lower barriers 132.

The external liner layer 161B may include a material that is shrinkable by subsequent annealing or Joule heating. In example embodiments, the external liner layer 161B may have a greater thickness than the internal liner layer 161A. In example embodiments, the external liner layer 161B may include a material different from that of the internal liner layer 161A. For example, the external liner layer 161B may include or may be formed of a silicon nitride layer, a silicon oxynitride layer, or a combination thereof. In example embodiments, the ALD or CVD process may be performed at a temperature of about 250° C. or less, for example, about 60° C. to about 250° C. to form the external liner layer 161B. While the external liner layer 161B is formed, reducing processing temperature for forming the external liner layer 161B may be advantageous to prevent the plurality of resistive memory patterns 140 from being deteriorated.

After the external liner layer 161B is formed, a space may remain between each of the plurality of resistive memory patterns 140 on the external liner layer 161B.

Figure 17:
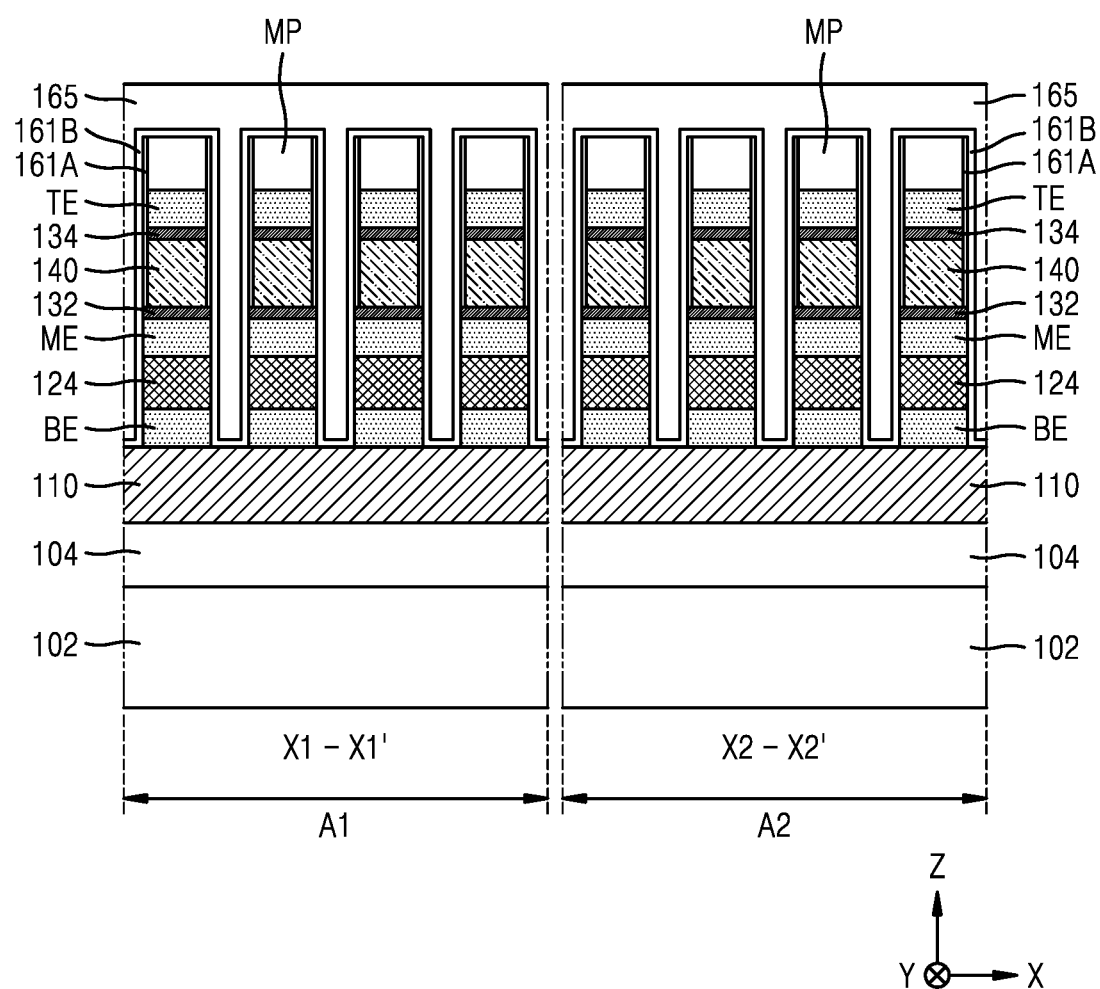

Referring to FIG. 17, in the result of FIG. 16, a gap fill insulating layer 165 filling a space remaining between each of the plurality of resistive memory patterns 140 may be formed.

A constituent material of the gap fill insulating layer 165 may be the same as that of the plurality of second gap fill insulating layers 168 described with reference to FIGS. 4, 5A, and 5B. In example embodiments, a spin coating process, the ALD or CVD process may be performed at a temperature of about 300° C. or less, for example, about 60° C. to about 300° C. to form the external liner layer 165. While the gap fill insulating layer 165 is formed, reducing processing temperature for forming the gap fill insulating layer 165 may be advantageous to prevent the plurality of resistive memory patterns 140 from being deteriorated.

Referring to FIG. 18, the plurality of upper electrodes TE may be exposed by planarizing the upper surface of the resultant of FIG. 17. As a result, the mask pattern MP may be removed, and heights of the inner liner layer 161A, the external liner layer 161B, and the gap fill insulating layer 165 may be reduced.

Referring to FIGS. 19A and 19B, the plurality of second conductive lines 170 and the plurality of second insulating patterns 172 may be formed on the result of FIG. 18.

Referring to FIGS. 20A and 20B, by applying heat to the first area A1 of the first area A1 and the second area A2 in the results of FIGS. 19A and 19B, contraction of the external liner layer 161B and expansion of the gap fill insulating layer 165 may be induced.

In example embodiments, the process of applying heat to the first area A1 in the results of FIGS. 19A and 19B may be performed during a process of forming a wiring structure (not illustrated) on the structure in the first area A1 in the results of FIGS. 19A and 19B. In example embodiments, the process of applying heat to the first area A1 may be performed at a temperature of at least 600° C., for example, under a temperature of about 620° C. to about 700° C.

In other example embodiments, after subsequent processes required for manufacturing the resistive memory device 100 on the results of FIGS. 19A and 19B are performed, by applying a voltage to each of the plurality of first conductive lines 110 and the plurality of second conductive lines 170 only in the first area A1 of the first area A1 and the second area A2 so that a current flows through the plurality of first conductive lines 110 and the plurality of second conductive lines 170 in the first area A1, the plurality of memory cells MC may operate only in the first area A1 from among the first area A1 and the second area A2. Because the plurality of memory cells MC operates only in the first area A1 from among the first area A1 and the second area A2, heat due to Joule heating may be transferred to the external liner layer 161B and the gap fill insulating layer 165 in the first area A1. For example, heat corresponding to a temperature of at least 600° C., for example, about 620° C. to about 700° C. may be applied to the external liner layer 161B and the gap fill insulating layer 165 in the first area A1 by Joule heating. As a result, the external liner layer 161B in the first area A1 may be contracted in a direction of a first arrow AR1 in the vicinity of the resistive memory pattern 140, and accordingly, the plurality of external liners 162B, or the result of contraction of the external liner layer 161B may be formed. In addition, the gap fill insulating layer 165 may expand in a direction of a second arrow AR2 in the vicinity of the resistive memory pattern 140, and the plurality of first gap fill insulating layers 166 as a result of the expansion of the gap fill insulating layer 165 may be formed. In this case, because a pressure is applied to the plurality of resistive memory patterns 140 due to contraction of the external liner layer 161B and expansion of the gap fill insulating layer 165, and thus, the width and height of the plurality of resistive memory patterns 140 are reduced, the plurality of first resistive memory patterns 140A may be formed from the plurality of resistive memory patterns 140 in the first area A1.

In the first area A1, according to the deformation of the external liner layer 161B and the resistive memory pattern 140, some region of the internal liner layer 161A between the first resistive memory pattern 140A and the external liner layer 161B may be moved toward the first resistive memory pattern 140A, and the structure of the internal liner layer 161A may be deformed. As a result, the internal liner 162A may be formed from the internal liner layer 161A in the first area A1.

While the first encapsulation insulating layer 162 including the internal liner 162A and the external liner 162B in the first area A1, the first encapsulation insulating layer 162, the first gap fill insulating layer 166, and the first resistive memory pattern 140A are formed through the processes described above, the second area A2 may hardly be affected by heat or Joule heating applied to the first area A1. Accordingly, in the second area A2, shapes of the internal liner layer 161A, the external liner layer 161B, the gap fill insulating layer 165, and the resistive memory pattern 140 may hardly be changed. As a result, in the second region A2, the internal liner 164A and the external liner 164B, the second gap fill insulating layer 168, and the second resistive memory pattern 140B, which have substantially the same shape as the internal liner layer 161A, the external liner layer 161B, the gap fill insulating layer 165, and the resistive memory pattern 140, respectively, may remain. The internal liner 164A and the external liner 164B may constitute the second encapsulation insulating layer 164.

For example, when the active memory cell AMC in the final structure of a reference resistive memory device includes the plurality of resistive memory patterns 140 illustrated in FIGS. 19A and 19B, due to Joule heating during the actual operation of the reference resistive memory device, the plurality of resistive memory patterns 140 may be contracted, and as a result, unwanted void regions may be formed in an area occupied by the plurality of resistive memory patterns 140. In addition, as a size of a side of the memory cell MC required in the resistive memory device becomes less, the density of the plurality of resistive memory patterns 140 may be reduced due to an etching process of forming the plurality of resistive memory patterns 140. Accordingly, due to the decrease in density of and/or the void regions in the plurality of resistive memory patterns 140, the lifespan of the reference resistive memory device may be reduced.

According to the technical idea of the inventive concept, as described with reference to FIGS. 20A and 20B from the results of FIGS. 19A and 19B including a plurality of resistive memory patterns 140, by selectively inducing thermal contraction of the external liner layer 161B and thermal expansion of the gap fill insulating layer 165 only in the first area A1 from among the first area A1 and the second area A2, and applying physical pressure on the plurality of resistive memory patterns 140, the void regions VD may be removed in advance from the plurality of resistive memory patterns 140. Accordingly, the plurality of first resistive memory patterns 140A including a material having a relatively high density may be formed in the first area A1. Accordingly, the deterioration of the resistive memory device 100 due to contraction of the plurality of first resistive memory patterns 140A during an actual operation of the resistive memory device 100 may be prevented, and thus, the lifespan of the resistive memory device 100 may be extended.

FIGS. 21 through 24 are cross-sectional views illustrated according to other example manufacturing methods of resistive memory devices, according to embodiments of the inventive concept. An example manufacturing method of the resistive memory device 200 illustrated in FIG. 6 is described with reference to FIGS. 21 through 24. FIGS. 21 through 24 illustrate primary components corresponding to the cross-sections taken along lines X1-X1' and X2-X2' in FIG. 4 according to a processing sequence.

Figure 21:
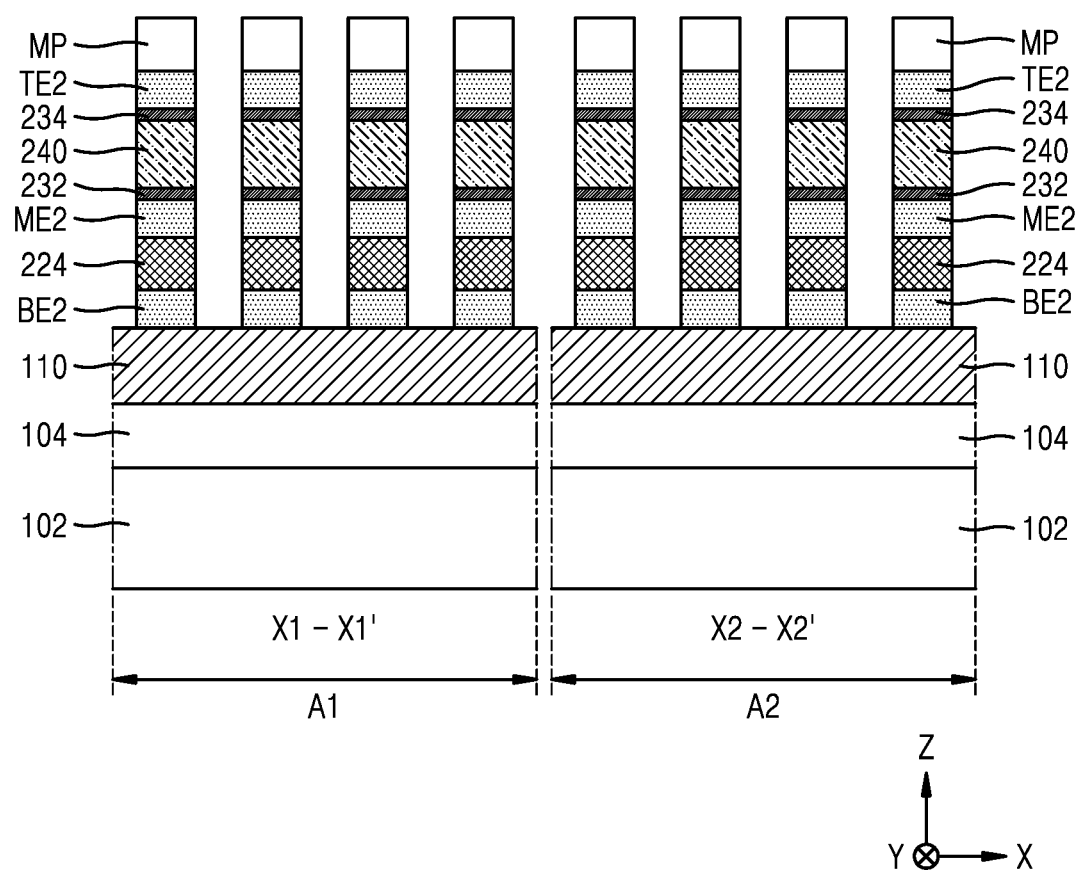
FIGS. 21 through 24 are cross-sectional views illustrating other example manufacturing methods of resistive memory devices according to a process sequence, according to embodiments of the inventive concept.

Referring to FIG. 21, in the same manner as described with reference to FIGS. 11A through 12B, in the first area A1 and the second area A2, after the plurality of first conductive lines 110, the plurality of first insulating patterns 112, the lower electrode layer BEL, the select element layer 124L, the middle electrode layer MEL, the lower barrier layer 132L, the resistive memory layer 140L, the upper barrier layer 134L, and the upper electrode layer TEL are formed on the substrate 102, and the mask pattern MP is formed on the upper electrode layer TEL, the plurality of upper electrodes TE2, the plurality of upper barriers 234, the plurality of resistive memory patterns 240, the plurality of lower barriers 232, the plurality of middle electrodes ME2, the plurality of select elements 224, and the plurality of lower electrodes BE2 may be formed by anisotropically etching the upper electrode layer TEL, the upper barrier layer 134L, the resistive memory layer 140L, the lower barrier layer 132L, the middle electrode layer MEL, the select element layer 124L, and the lower electrode layer BEL by using the mask pattern MP as an etching mask in the results of FIGS. 12A and 12B. While the anisotropic etching process is performed, a portion of the mask pattern MP may be consumed, and accordingly, the thickness of the mask pattern MP may be reduced.

Figure 22:
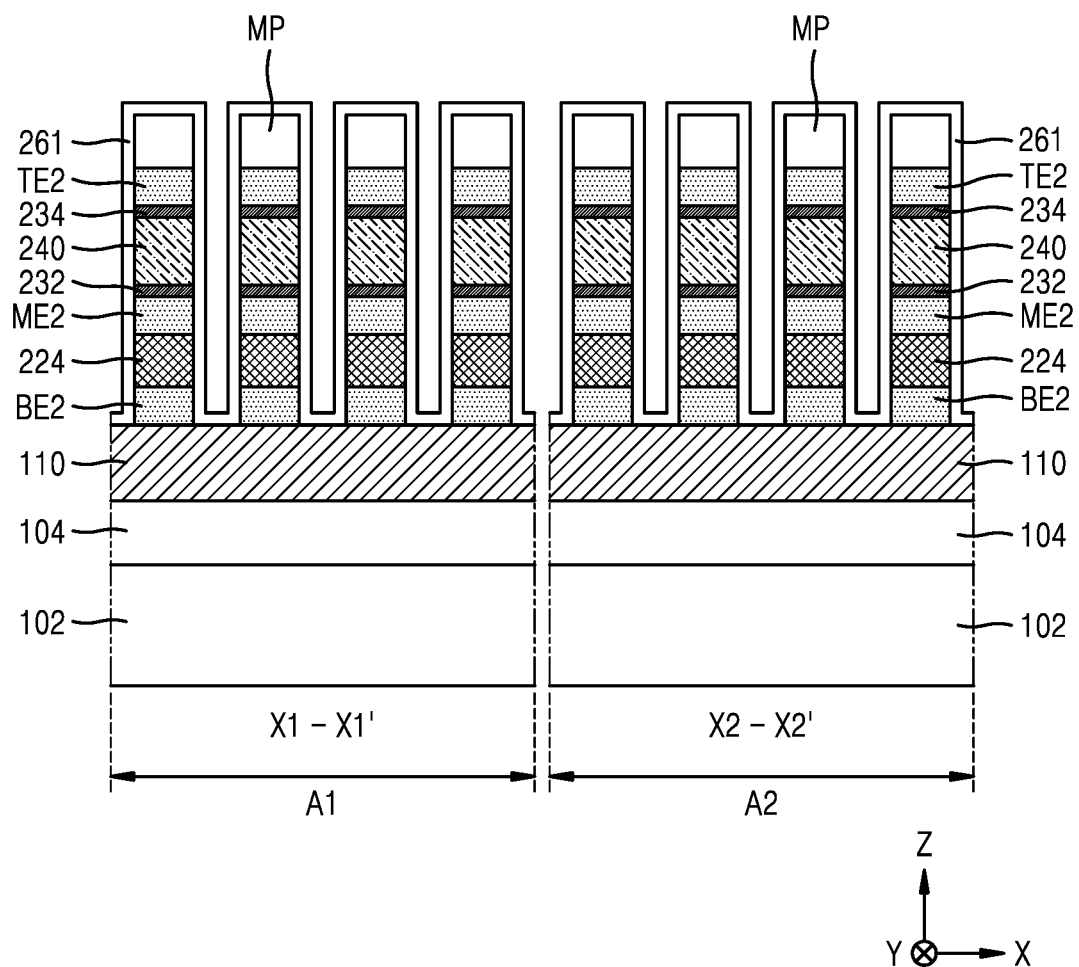

Referring to FIG. 22, a liner layer 261 conformally covering surfaces exposed in the result of FIG. 21 may be formed. The liner layer 261 may contact sidewalls of each of the plurality of lower electrodes BE2, the plurality of select elements 224, the plurality of middle electrodes ME2, the plurality of lower barriers 232, the plurality of resistive memory patterns 240, the plurality of upper barrier 234, and the plurality of upper electrodes TE2.

The liner layer 261 may include a material that is shrinkable by subsequent annealing or Joule heating. The liner layer 261 may include or may be formed of a silicon oxide layer, a silicon oxynitride layer, or a combination thereof. In example embodiments, a method similar to the method described with reference to FIG. 16 of forming the external liner layer 161B may be used to form the liner layer 261. After the liner layer 261 is formed, a space may remain between each of the plurality of resistive memory patterns 240 on the liner layer 261.

Figure 23:
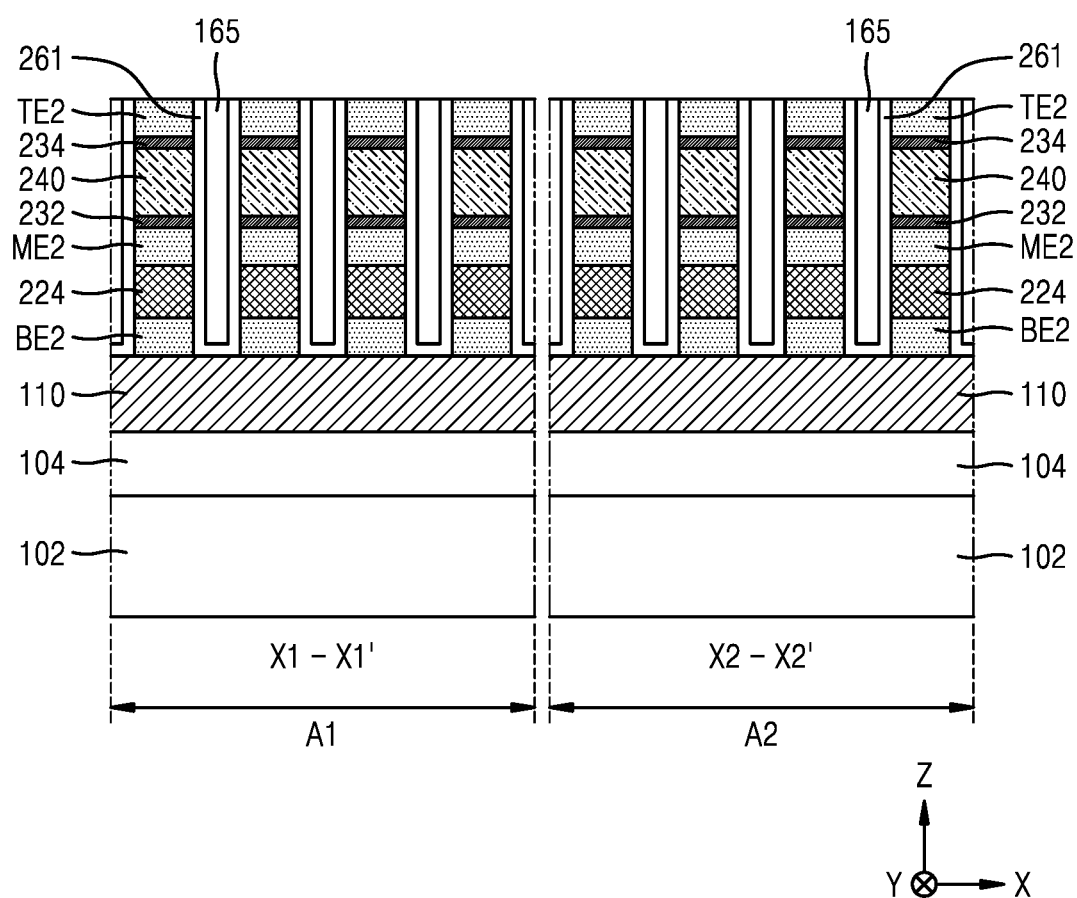

Referring to FIG. 23, after the gap fill insulating layer 165 is formed on the result of FIG. 22 by using the method described with reference to FIG. 17, by planarizing the result thereof by using a method similar to the method described with reference to FIG. 18, the plurality of upper electrode TE2 may be exposed. As a result, the mask pattern MP may be removed, and the height of each of the liner layer 261 and the gap fill insulating layer 165 may be reduced.

Figure 24:
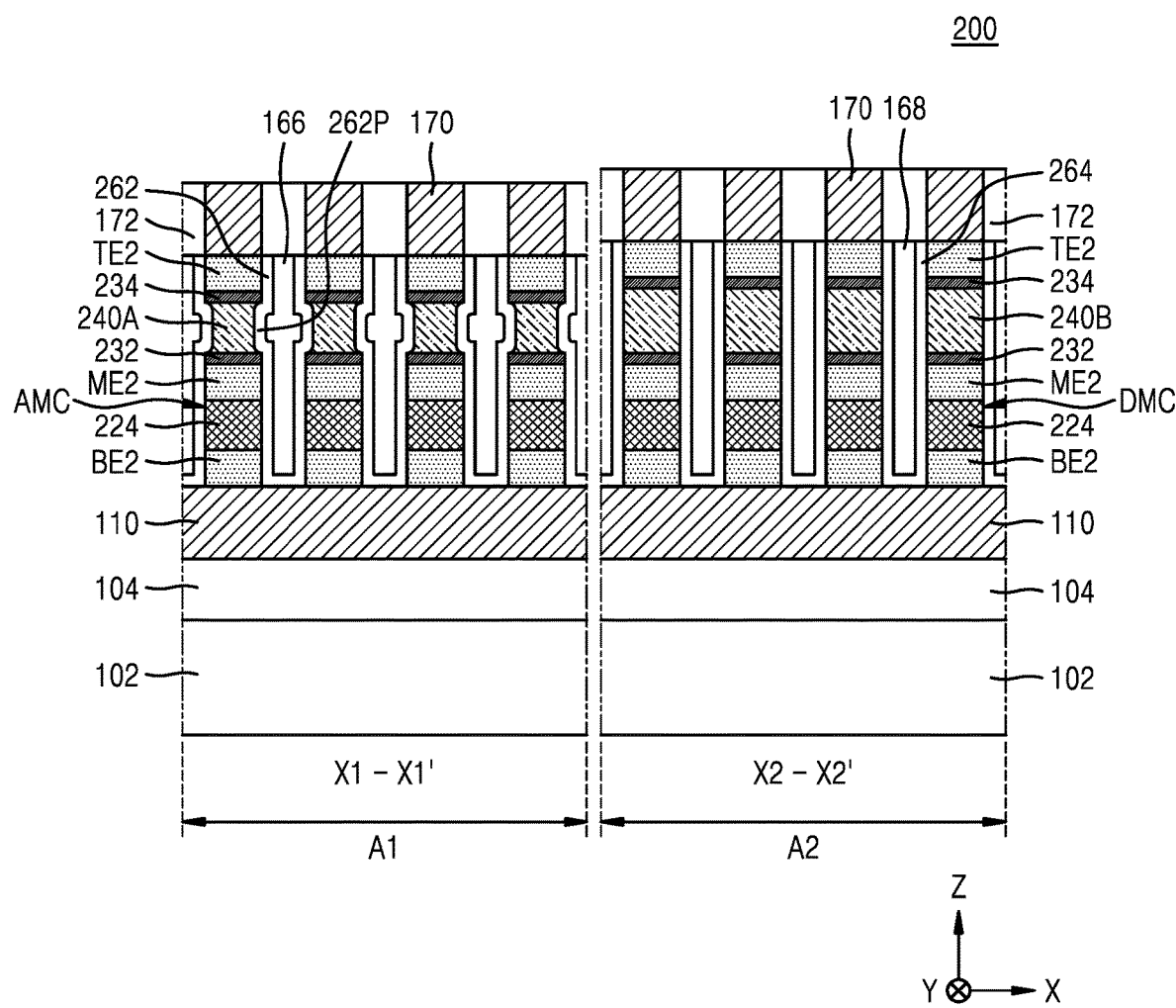

Referring to FIG. 24, after the plurality of second conductive lines 170 and the plurality of second insulating patterns 172 are formed on the result of FIG. 23 in the same manner as described with reference to FIGS. 19A and 19B, the resistive memory device 200 illustrated in FIG. 6 may be manufactured by applying heat or Joule heating to the result in which the plurality of second conductive lines 170 and the plurality of second insulating patterns 172 have been formed, only in the first area A1 from among the first area A1 and the second area A2, in a method similar to the method described with reference to FIGS. 20A and 20B.

The manufacturing method of the resistive memory device 100 illustrated in FIGS. 4, 5A, and 5B and the resistive memory device 200 illustrated in FIG. 6 has been described with reference to FIGS. 11A through 20B and FIGS. 21 through 24. However, it will be understood by those of skill in the art that the resistive memory devices 300, 400, 500, and 600 illustrated in FIGS. 7 through 10, or resistive memory devices having various structures modified and changed within the scope of the technical idea of the inventive concept may be manufactured by using the processes described with reference to FIGS. 11A through 20B and FIGS. 21 through 24, or various methods modified and changed within the scope of the technical idea of the inventive concept.

While the inventive concept has been particularly shown and described with reference to embodiments thereof, it will be understood that various changes in form and details may be made therein without departing from the spirit and scope of the following claims.

What is claimed is:

1. A resistive memory device comprising:
a plurality of first conductive lines extending in a first horizontal direction in a first area and a second area on a substrate, the first horizontal direction being parallel to the substrate;
a plurality of second conductive lines extending in a second horizontal direction crossing the first horizontal direction in the first area and the second area, the plurality of second conductive lines being apart from the plurality of first conductive lines in a vertical direction, the vertical direction being perpendicular to the substrate; and
a plurality of memory cells connected to the first conductive lines and the second conductive lines at a plurality of intersections between the plurality of first conductive lines and the plurality of second conductive lines in the first area and the second area,
wherein the plurality of memory cells comprise an active memory cell in the first area and a dummy memory cell in the second area, the active memory cell including a first resistive memory pattern having a first width in a horizontal direction, and the dummy memory cell including a second resistive memory pattern having a second width in the horizontal direction, and the first width is less than the second width.

2. The device of claim 1, wherein a height of the first resistive memory pattern in the vertical direction is less than a height of the second resistive memory pattern in the vertical direction.

3. The device of claim 1, further comprising:
a plurality of encapsulation insulating layers covering sidewalls of each of the plurality of memory cells in the first area and the second area; and
a gap fill insulating layer located between adjacent memory cells of the plurality of memory cells in the first area and the second area, the gap fill insulating layer being set apart from the plurality of memory cells with the plurality of encapsulation insulating layers therebetween and wherein, the gap fill insulating layer having a thermal expansion coefficient greater than that of a constituent material of the plurality of encapsulation insulating layers.

4. The device of claim 1, further comprising, in the first area, a first encapsulation insulating layer in contact with a sidewall of the first resistive memory pattern, and,
in the first area, a first gap fill insulating layer located in a space between adjacent memory cells of the plurality of memory cells and set apart from the first resistive memory pattern with the first encapsulation insulating layer therebetween,
wherein the first gap fill insulating layer has a thermal expansion coefficient greater than that of a constituent material of the first encapsulation insulating layer.

5. The device of claim 1, wherein, in the first area and the second area, the plurality of memory cells further comprise a select element, and
in the horizontal direction, a width of the first resistive memory pattern is less than a width of the select element.

6. The device of claim 1, further comprising an insulating layer covering a sidewall of the active memory cell,
wherein, in the horizontal direction, a width of a portion of the insulating layer covering the first resistive memory pattern of the active memory cell is greater than a width of a portion of the insulating layer covering a portion of the active memory cell other than the first resistive memory pattern.

7. The device of claim 1, wherein, in the first area and the second area, the plurality of memory cells further comprise a select element, and
a difference in width in a horizontal direction between a width of the first resistive memory pattern and a width of the select element in the first area is greater than a difference in width in the horizontal direction between a width of the second resistive memory pattern and a width of the select element in the second area.

8. The device of claim 1, wherein each of the plurality of memory cells further comprises an electrode layer in the first area and the second area, and
a difference in width in a horizontal direction between a width of the first resistive memory pattern and a width of the electrode layer in the first area is greater than a difference in width in the horizontal direction between a width of the second resistive memory pattern and a width of the electrode layer in the second area.

9. The device of claim 1, further comprising:
a gap fill insulating layer covering the first resistive memory pattern in the first area and comprising carbon (C) atoms; and
an encapsulation insulating layer between the first resistive memory pattern and the gap fill insulating layer, the encapsulation insulating layer not comprising C atoms.

10. The device of claim 1, wherein the active memory cell further comprises a lower barrier in contact with a lower surface of the first resistive memory pattern, and an upper barrier in contact with an upper surface of the first resistive memory pattern, and
in the horizontal direction, the first width of the first resistive memory pattern is less than a width of each of the lower barrier and the upper barrier.

11. A resistive memory device comprising:
a plurality of first conductive lines extending in a first horizontal direction in a first area and a second area on a substrate, the first horizontal direction being parallel to the substrate;
a plurality of second conductive lines extending in a second horizontal direction crossing the first horizontal direction in the first area and the second area, the plurality of second conductive lines being apart from the plurality of first conductive lines in a vertical direction, the vertical direction being perpendicular to the substrate;
a plurality of memory cells connected to the first conductive lines and the second conductive lines at a plurality of intersections between the plurality of first conductive lines and the plurality of second conductive lines in the first area and the second area;

a plurality of resistive memory patterns comprised in the plurality of memory cells in the first area and the second area; and an insulating layer configured to fill a space between adjacent memory cells of the plurality of memory cells in the first area and the second area, wherein a first volume of a first resistive memory pattern in the first area of the plurality of resistive memory patterns is less than a second volume of a second resistive memory pattern in the second area.

12. The device of claim 11, wherein a first width of the first resistive memory pattern in the first horizontal direction is less than a second width of the second resistive memory pattern in the first horizontal direction, and a first height of the first resistive memory pattern in the vertical direction is less than a second height of the second resistive memory pattern in the vertical direction.

13. The device of claim 11, wherein the insulating layer comprises an encapsulation insulating layer in contact with a sidewall of each of the plurality of resistive memory patterns, and a gap fill insulating layer covering a sidewall of each of the plurality of resistive memory patterns at a location apart from the plurality of resistive memory patterns, and wherein the gap fill insulating layer has a thermal expansion coefficient greater than that of a constituent material of the encapsulation insulating layer.

14. The device of claim 11, wherein the plurality of memory cells comprise an upper electrode in the first area, the upper electrode is at a location farther than the first resistive memory pattern from the substrate in the vertical direction, and wherein a width, in the first horizontal direction, of a portion of the insulating layer covering the first resistive memory pattern is greater than a width of a portion of the insulating layer covering the upper electrode.

15. The device of claim 11, wherein the second resistive memory pattern comprises a void region.

16. A resistive memory device comprising:
a plurality of memory cells in a first area and a second area on a substrate;
a plurality of encapsulation insulating layers in contact with sidewalls of each of the plurality of memory cells in the first area and the second area; and
a plurality of gap fill insulating layers configured to fill a space between each of the plurality of memory cells at locations apart from each of the plurality of memory cells in a horizontal direction in the first area and the second area, the plurality of gap fill insulating layers having a thermal expansion coefficient greater than that of a constituent material of the plurality of encapsulation insulating layers, the horizontal direction being parallel to the substrate, wherein the plurality of memory cells comprise a plurality of active memory cells in the first area and comprising a first resistive memory pattern having a first width in the horizontal direction, and a plurality of dummy memory cells in the second area and comprising a second resistive memory pattern having a second width in the horizontal direction, and the first width is less than the second width.

17. The device of claim 16, wherein a first height of the first resistive memory pattern in a vertical direction is less than a second height of the second resistive memory pattern in the vertical direction, wherein the vertical direction is perpendicular to the substrate.

18. The device of claim 16, wherein the plurality of encapsulation insulating layers comprise a silicon oxide layer, a silicon nitride layer, a silicon oxynitride layer, or a combination thereof.

19. The device of claim 16, wherein the plurality of gap fill insulating layers comprise SiOC, SiOCH, SiOH, hydrogen silsesquioxane-based flowable oxide (HSQ), aluminum oxide, aluminum nitride, zirconium oxide, strontium oxide, lanthanum oxide, yttrium oxide, or a combination thereof.

20. The device of claim 16, wherein the first width of the first resistive memory pattern is about 80% to about 95% of the second width of the second resistive memory pattern.

* * * * *